(12) United States Patent
Sugiura et al.

(10) Patent No.: US 12,283,297 B2
(45) Date of Patent: Apr. 22, 2025

(54) MEMORY DEVICE

(71) Applicant: Kioxia Corporation, Tokyo (JP)

(72) Inventors: Kuniaki Sugiura, Seoul (KR); Taichi Igarashi, Seoul (KR)

(73) Assignee: Kioxia Corporation, Tokyo (JP)

( * ) Notice: Subject to any disclaimer, the term of this patent is extended or adjusted under 35 U.S.C. 154(b) by 364 days.

(21) Appl. No.: 17/843,084

(22) Filed: Jun. 17, 2022

(65) Prior Publication Data

US 2023/0298647 A1 Sep. 21, 2023

(30) Foreign Application Priority Data

Mar. 18, 2022 (JP) ................. 2022-044000

(51) Int. Cl.
| | | |
|---|---|---|
| G11C 11/16 | (2006.01) | |
| H10B 61/00 | (2023.01) | |
| H10N 50/01 | (2023.01) | |
| H10N 50/80 | (2023.01) | |

(52) U.S. Cl.
CPC ........ G11C 11/161 (2013.01); G11C 11/1675 (2013.01); H10B 61/00 (2023.02); H10N 50/01 (2023.02); H10N 50/80 (2023.02)

(58) Field of Classification Search
CPC .............. G11C 11/161; G11C 11/1675; G11C 11/1653; G11C 13/0023; G11C 13/003; G11C 13/0069; G11C 11/1659; H10B 61/00; H10B 61/10; H10N 50/01; H10N 50/80; H10N 50/10
USPC ........................................................ 365/158
See application file for complete search history.

(56) References Cited

U.S. PATENT DOCUMENTS

| | | | |
|---|---|---|---|
| 8,324,735 B2 | 12/2012 | Higuchi | |
| 8,508,976 B2 | 8/2013 | Katayama et al. | |
| 8,835,895 B2 | 9/2014 | Sumino et al. | |
| 9,905,510 B2 | 2/2018 | Komori | |
| 10,741,491 B1* | 8/2020 | Cho | ........ H10B 63/80 |
| 11,683,940 B2* | 6/2023 | Lee | ........ H10B 63/80 257/5 |
| 2017/0278849 A1* | 9/2017 | Mori | ........ H01L 29/6659 |

(Continued)

FOREIGN PATENT DOCUMENTS

| | | |
|---|---|---|
| CN | 111799295 A | 10/2020 |
| JP | 4628500 B2 | 11/2010 |

(Continued)

OTHER PUBLICATIONS

U.S. Appl. No. 17/550,194, First Named Inventor: Taichi Igarashi; Title: "Memory Device"; filed Dec. 14, 2021.

*Primary Examiner* — Huan Hoang
(74) *Attorney, Agent, or Firm* — Holtz, Holtz & Volek PC

(57) ABSTRACT

According to one embodiment, a memory device includes: a first memory cell; a second memory cell; a first circuit configured to supply a write current to the first memory cell and the second memory cell; a first wiring coupled to the first circuit; a first electrode configured to electrically couple the first memory cell to the first wiring; and a second electrode configured to electrically couple the second memory cell to the first wiring. A length of the first wiring from the first circuit to the first electrode is smaller than a length of the first wiring from the first circuit to the second electrode. A resistance value of the first electrode is higher than a second resistance value of the second electrode.

20 Claims, 31 Drawing Sheets

(56) References Cited

U.S. PATENT DOCUMENTS

2022/0005829 A1* 1/2022 Hu .................. H10B 53/20
2022/0085282 A1 3/2022 Sugiura

FOREIGN PATENT DOCUMENTS

JP 5632062 B2 10/2014
JP 6581012 B2 9/2019

* cited by examiner

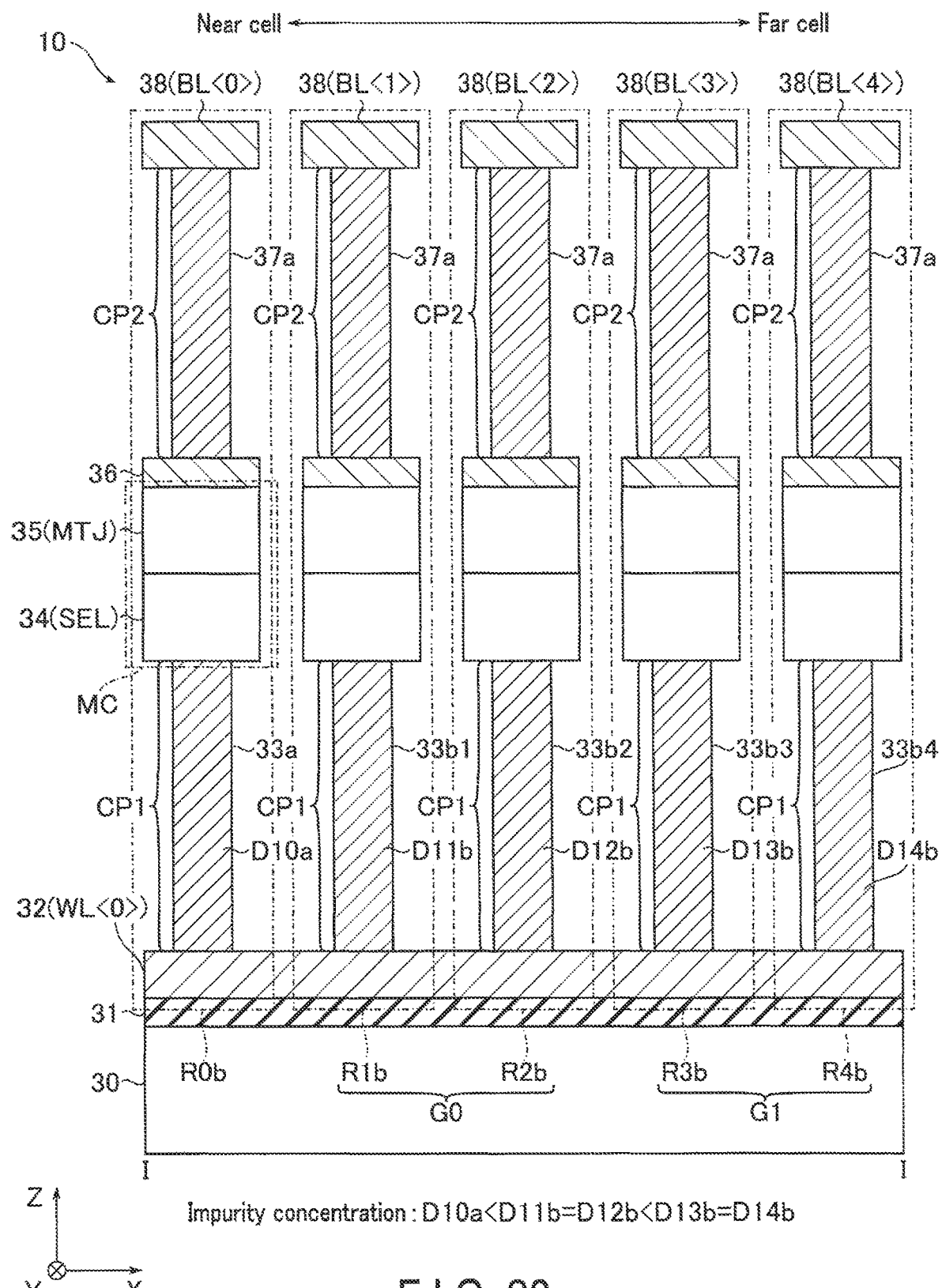
F I G. 20

Diameter: dm0<dm1=dm2<dm3=dm4

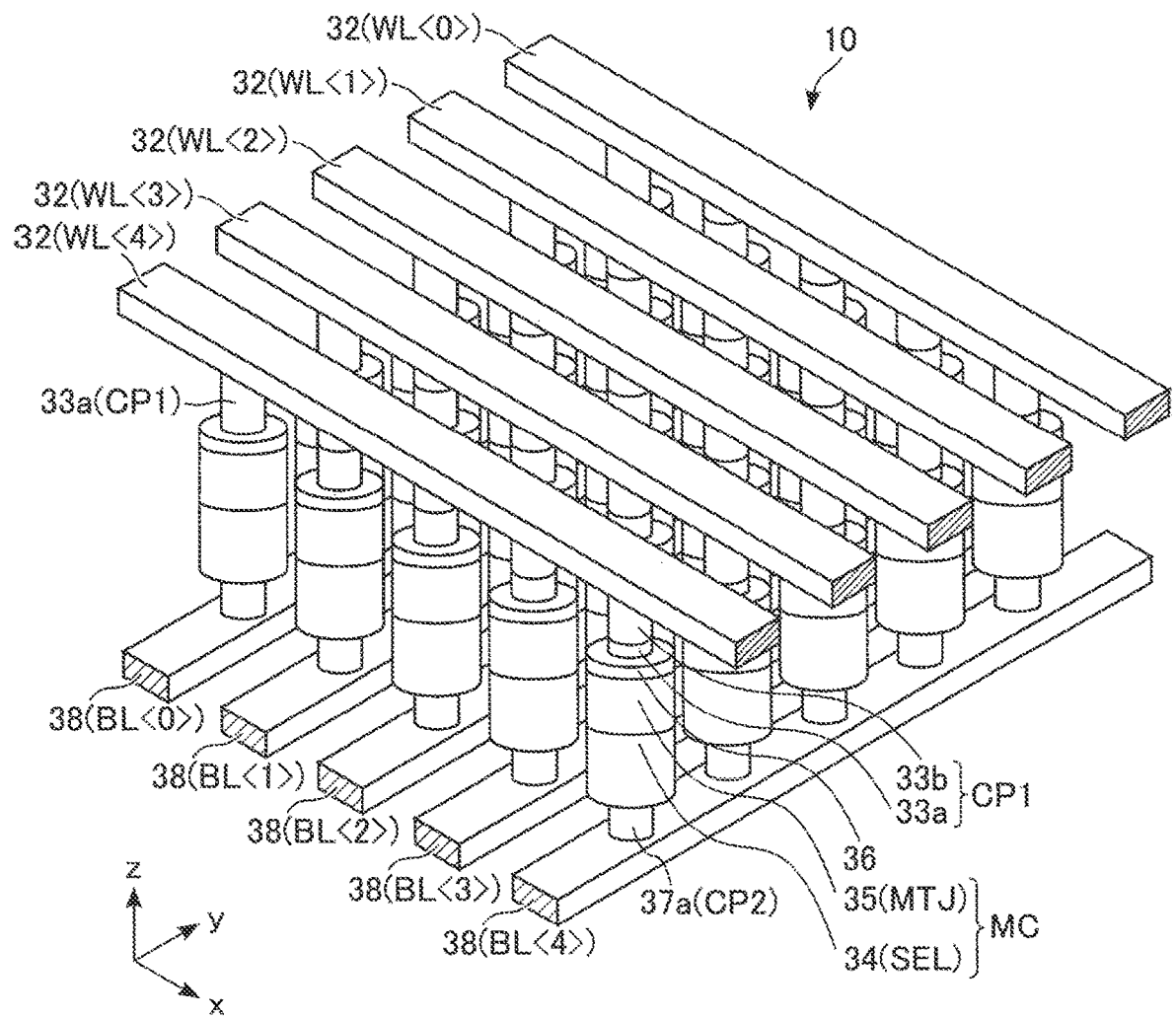
F I G. 26

MEMORY DEVICE

CROSS-REFERENCE TO RELATED APPLICATIONS

This application is based upon and claims the benefit of priority from Japanese Patent Application No. 2022-044000, filed Mar. 18, 2022, the entire contents of which are incorporated herein by reference.

FIELD

Embodiments described herein relate generally to a memory device.

BACKGROUND

A memory device using a variable resistance element as a memory element is known. For example, a magnetoresistive random access memory (MRAM) using a magnetoresistance effect element as a variable resistance element is known.

BRIEF DESCRIPTION OF THE DRAWINGS

FIG. 20 is a cross-sectional view showing one example of a cross-sectional structure of a memory cell array included in a memory device according to a fourth modification of the first embodiment.

FIG. 26 is a perspective view showing part of the memory cell array included in the memory device according to the third embodiment.

DETAILED DESCRIPTION

Figure 1:
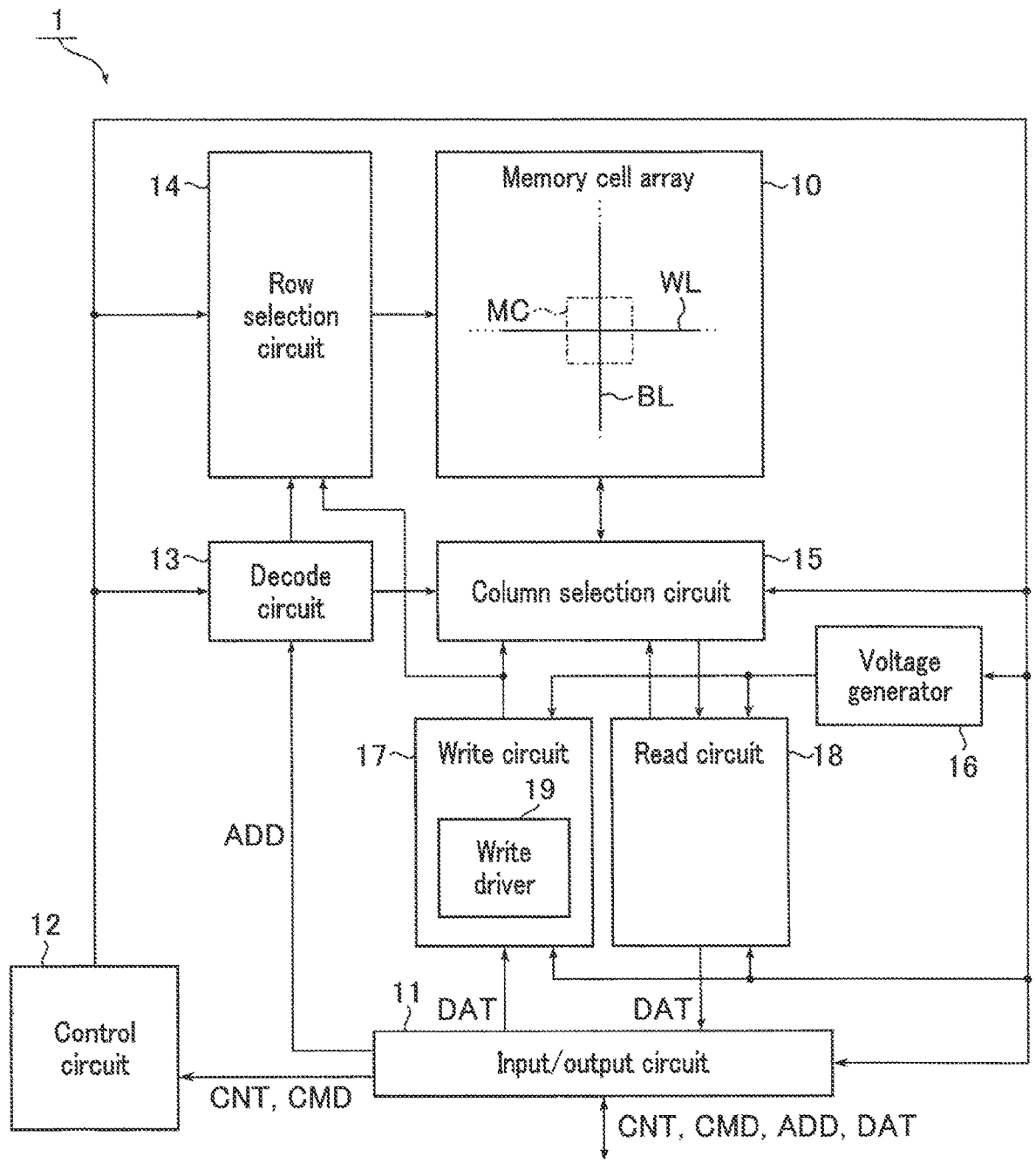
FIG. 1 is a block diagram showing a configuration of a memory device according to a first embodiment.

In general, according to one embodiment, a memory device includes: a first memory cell; a second memory cell; a first circuit configured to supply a write current to the first memory cell and the second memory cell; a first wiring coupled to the first circuit; a first electrode configured to electrically couple the first memory cell to the first wiring; and a second electrode configured to electrically couple the second memory cell to the first wiring. A length of the first wiring from the first circuit to the first electrode is smaller than a length of the first wiring from the first circuit to the second electrode. A resistance value of the first electrode is higher than a second resistance value of the second electrode.

Hereinafter, embodiments will be described with reference to the accompanying drawings. In the following description, constituent elements having substantially the same function and configuration will be assigned the same reference numeral or symbol. In the case where elements having similar configurations are distinguished from each other in particular, their identical reference symbols may be assigned different letters or numbers.

1. First Embodiment

A memory device according to a first embodiment will be described. The memory device according to the first embodiment is, for example, a magnetoresistive random access memory in which an element having a magnetoresistance effect provided by a magnetic tunnel junction (MTJ) (such an element may be called an MTJ element or a magnetoresistance effect element) is used as a variable resistance element. The present embodiment and embodiments and modifications described below are based on a case in which an MTJ element is used as a variable resistance element, which is referred to as a magnetoresistance effect element MTJ herein.

1.1 Configuration
1.1.1 Configuration of Memory Device

A configuration of the memory device according to the first embodiment will be described with reference to FIG. 1. FIG. 1 is a block diagram showing a configuration of the memory device. A memory device 1 includes a memory cell array 10, an input/output circuit 11, a control circuit 12, a decode circuit 13, a row selection circuit 14, a column selection circuit 15, a voltage generator 16, a write circuit 17, and a read circuit 18.

The memory cell array 10 is a nonvolatile memory. The memory cell array 10 includes a plurality of memory cells MC each associated with a pair of a row and a column. Each of the memory cells MC stores data in a nonvolatile manner. For example, the memory cells MC arranged in the same row are coupled to the same word line WL. The memory cells MC arranged in the same column are coupled to the same bit line BL.

The input/output circuit 11 is a circuit configured to transmit and receive data. The input/output circuit 11 receives a control signal CNT, a command CMD, an address ADD, and data (write data) DAT from an outside of the memory device 1. The input/output circuit 11 transmits the control signal CNT and the command CMD to the control circuit 12. The input/output circuit 11 transmits the address ADD to the decode circuit 13. The input/output circuit 11 transmits the data (write data) DAT to the write circuit 17. The input/output circuit 11 receives data (read data) DAT from the read circuit 18. The input/output circuit 11 transmits the data (read data) DAT to the outside of the memory device 1.

The control circuit 12 is a circuit configured to control the overall operation of the memory device 1. The control circuit 12 controls, based on the control signal CNT and the command CMD, the operations of the input/output circuit 11, the decode circuit 13, the row selection circuit 14, the column selection circuit 15, the voltage generator 16, the write circuit 17, and the read circuit 18.

The decode circuit 13 is a circuit configured to decode the address ADD. The decode circuit 13 receives the address ADD from the input/output circuit 11. The decode circuit 13 decodes the address ADD. The decode circuit 13 transmits a decoding result of the address ADD to the row selection circuit 14 and the column selection circuit 15. The address ADD includes a row address and a column address.

The row selection circuit 14 is a circuit configured to select a word line WL corresponding to a row of the memory cell array 10. The row selection circuit 14 is coupled to the memory cell array 10 via the word lines WL. The row selection circuit 14 receives a decoding result (row address) of the address ADD from the decode circuit 13. The row selection circuit 14 selects a word line WL corresponding to a row based on the decoding result of the address ADD.

The column selection circuit 15 is a circuit configured to select a bit line BL corresponding to a column of the memory cell array 10. The column selection circuit 15 is coupled to the memory cell array 10 via the bit lines BL. The column selection circuit 15 receives a decoding result (column address) of the address ADD from the decode circuit 13. The column selection circuit 15 selects a bit line BL corresponding to a column based on the decoding result of the address ADD.

The voltage generator 16 is a circuit configured to generate a voltage for various operations of the memory cell array 10 by using a power supply voltage applied from the outside of the memory device 1. For example, the voltage generator 16 generates a voltage for use in a write operation (hereinafter also referred to as a "write voltage". The voltage generator 16 supplies the write voltage to the write circuit 17. The voltage generator 16 generates a voltage for use in a read operation (hereinafter also referred to as a "read voltage"). The voltage generator 16 supplies the read voltage to the read circuit 18.

The write circuit 17 is a circuit configured to write data to the memory cells MC. The write circuit 17 includes a write driver 19. The write circuit 17 receives the write data DAT from the input/output circuit 11. The write voltage is applied to the write circuit 17 by the voltage generator 16. The write driver 19 is, for example, a constant current driver circuit. The write driver 19 supplies a current based on the write voltage (a current for use in a write operation, hereinafter also referred to as a "write current") to the row selection circuit 14 and the column selection circuit 15. The row selection circuit 14 and the column selection circuit 15 supply the write current to the memory cell array 10 via the selected word line WL and bit line BL.

The read circuit 18 is a circuit configured to read data from the memory cells MC. The read circuit 18 includes a sense amplifier (not shown). The read voltage is applied to the read circuit 18 by the voltage generator 16. The read circuit 18 supplies the read voltage to the column selection circuit 15. The column selection circuit 15 supplies the read voltage to the memory cell array 10 via the selected bit line BL. a voltage of the bit line BL is applied to the read circuit 18 by the column selection circuit 15. The sense amplifier retrieves data stored in the memory cell MC based on the voltage of the bit line BL. The read circuit 18 transmits the retrieved data as the read data DAT to the input/output circuit 11.

1.1.2 Circuit Configuration of Memory Cell Array

Figure 2:
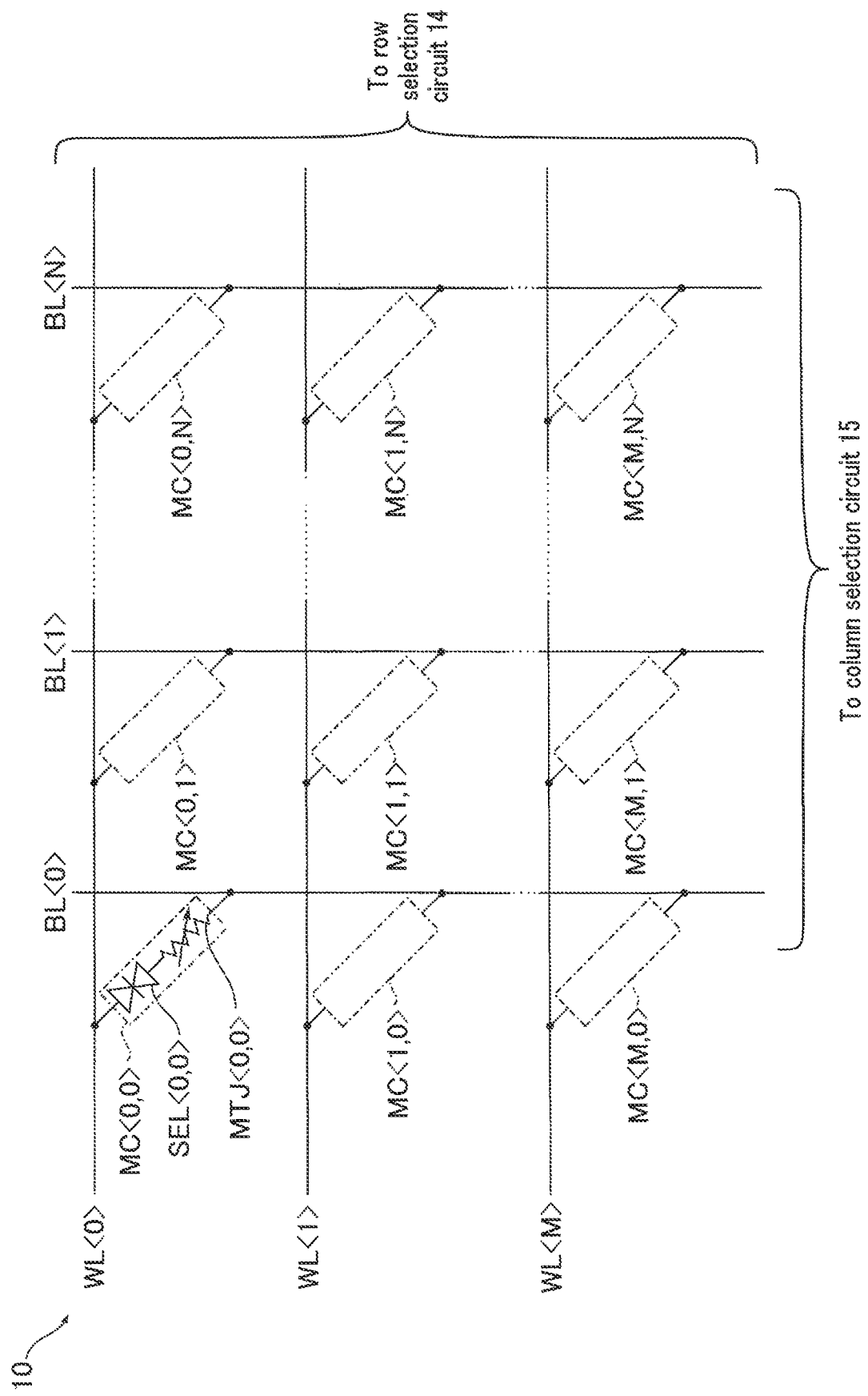
FIG. 2 is a circuit diagram showing one example of a circuit configuration of a memory cell array included in the memory device according to the first embodiment.

A circuit configuration of the memory cell array 10 will be described with reference to FIG. 2. FIG. 2 is a circuit diagram showing one example of a circuit configuration of the memory cell array 10. In FIG. 2, the memory cells MC, the word lines WL, and the bit lines BL are each distinguished by subscripts with indices "< >".

As shown in FIG. 2, the memory cells MC are arranged in a matrix pattern within the memory cell array 10. Each of the memory cells MC is associated with a pair including one of the word lines WL (WL<0>, WL<1>, ..., WL<M>) and one of the bit lines BL (BL<0>, BL<1>, ..., BL<N>) (M and N are given integers). That is, a memory cell MC<i,j> ($0 \leq I \leq M$, $0 \leq j \leq N$) is coupled between a word line WL<i> and a bit line BL<j>. A memory cell MC<i,j> includes a switching element SEL<i,j> and a magnetoresistance effect element MTJ<i,j> coupled in series thereto.

The switching element SEL has a function as a selector that controls a supply of a current to a corresponding magnetoresistance effect element MTJ when data is read to and written from the magnetoresistance effect element MTJ.

The description will assume the switching element SEL in the present embodiment to have two terminals. When a voltage applied between the two terminals of the switching element SEL is smaller than a first threshold value, the switching element SEL is in a high-resistance state, for example, an electrically non-conductive state (OFF state). When the voltage applied between the two terminals of the switching element SEL rises to reach the first threshold value or greater, the switching element SEL transitions to a low-resistance state, for example, an electrically conductive state (ON state). When the voltage applied between the two terminals of the switching element SEL in the low-resistance state drops to a second threshold value or smaller, the switching element SEL transitions to the high-resistance state. With respect to the function to switch between the high-resistance state and the low-resistance state based on a value of voltage applied in a first direction, the switching element SEL has the same function in a second direction opposite to the first direction, too. That is, the switching element SEL is a bidirectional switching element. By turning on or off the switching element SEL, it is possible to perform control as to whether or not to supply a current to an MTJ element MTJ coupled to this switching element SEL, namely, whether or not to select the MTJ element MTJ.

The present embodiment can use a switching element having characteristics in which the resistance value drops sharply with a certain voltage and along with this, an applied voltage drops sharply and a current increases (snapback).

Furthermore, the present embodiment can use a switching element which is substantially constituted by, for example, a composition including silicone (Si), oxygen (O) and a predetermined element selected from arsenic (As), phosphorus (P), antimony (Sb), sulfur (S), selenium (Se), and tellurium (Te) (for example, silicon oxide (SiOx) including the aforementioned predetermined element).

Meanwhile, expressions including "substantially" (such as "substantially constituted by") and similar expressions mean that a material (composition) "substantially constituted by" something may include unintended impurities.

With a current supply controlled by the switching element SEL, the magnetoresistance effect element MTJ can be switched between the low-resistance state and the high-resistance state. The magnetoresistance effect element MTJ functions as a memory element that allows data to be written therein according to a change in its resistance state, stores written data in a nonvolatile manner, and allows data to be read therefrom.

1.1.3 Structure of Memory Cell Array

One example of the structure of the memory cell array 10 will be described. In the drawings mentioned below, the X direction corresponds to the extending direction of the word lines WL, the Y direction corresponds to the extending direction of the bit lines BL, and the Z direction corresponds to the direction vertical to the surface of a semiconductor substrate for use in formation of the memory device 1.

(Planar Structure)

Figure 3:
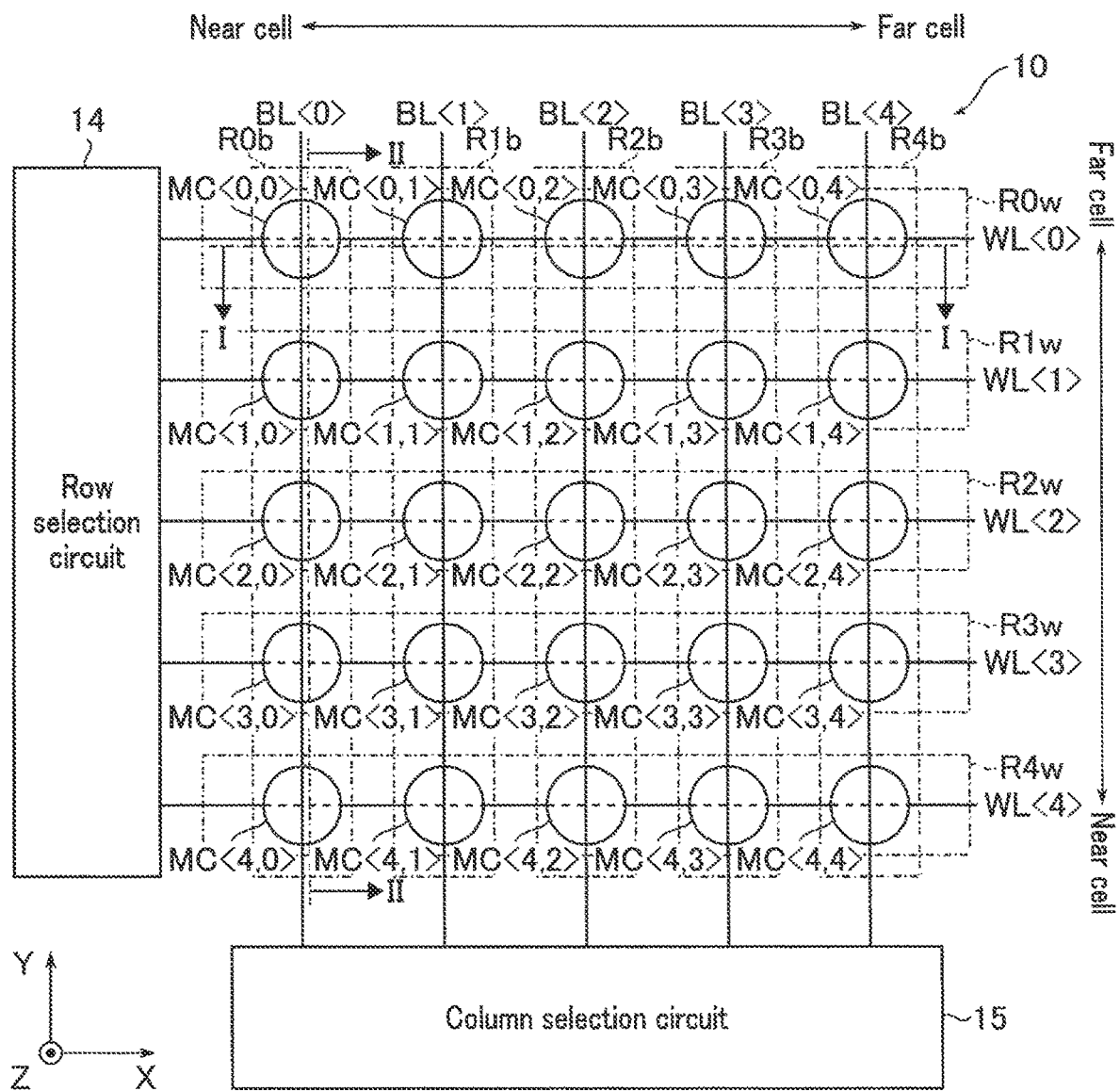
FIG. 3 is a plan view showing one example of a planar structure of the memory cell array included in the memory device according to the first embodiment.

A planar structure of the memory cell array 10 will be described with reference to FIG. 3. FIG. 3 is a plan view showing one example of a planar structure of the memory cell array 10. FIG. 3 shows the word lines WL between the plurality of memory cells MC and the row selection circuit 14, and the bit lines BL between the plurality of memory cells MC and the column selection circuit 15 in the memory cell array 10. FIG. 3 omits the word lines WL<5> to WL<M>, the bit lines BL<5> to BL<N>, and the plurality of memory cells MC corresponding to these word and bit lines.

Figure 6:
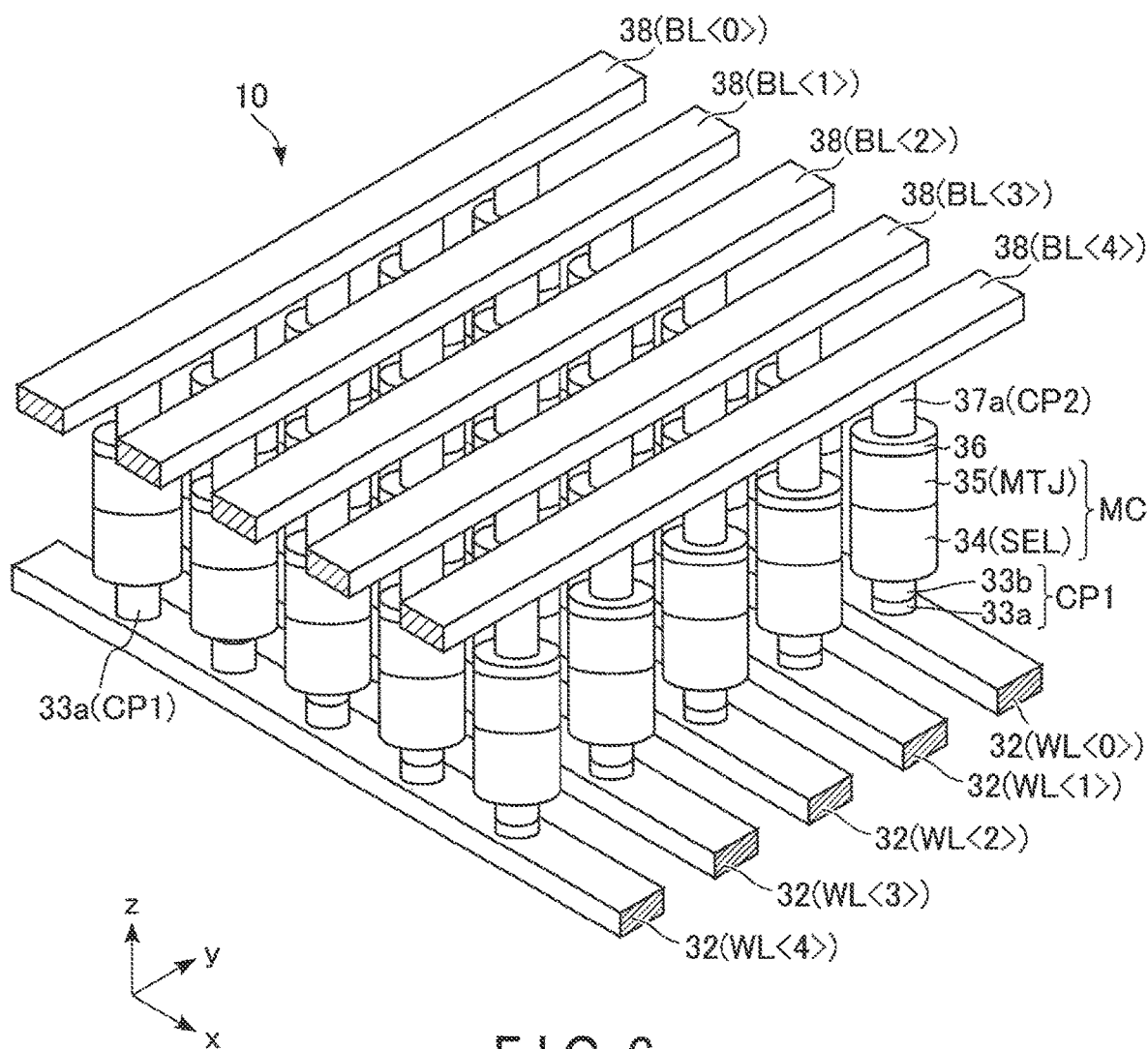
FIG. 6 is a perspective view showing part of the memory cell array included in the memory device according to the first embodiment.

The planar structure herein indicates a structure (a single-layered structure) in which one memory cell MC can be selected according to a pair of one word line WL and one bit line BL in the Z direction as in the structure shown in FIG. 6. In the following, the expression "planer structure" will be used in a similar sense.

As shown in FIG. 3, in the memory cell array 10, for example, the memory cells MC are arranged above the word lines WL. The bit lines BL are arranged above the memory cells MC.

Each of the word lines WL is coupled to the row selection circuit 14 and the plurality of memory cells MC arranged in the X direction. The row selection circuit 14 supplies the write current to the memory cells MC via the word lines WL. In the following, regions including the plurality of memory cells MC coupled to each of the word lines WL<0> to WL<4> will be referred to as regions R0w to R4w, respectively. The region R0w includes the memory cells MC<0,0> to MC<0,N>. The region R1w includes the memory cells MC<1,0> to MC<1,N>. The region R2w includes the memory cells MC<2,0> to MC<2,N>. The region R3w includes the memory cells MC<3,0> to MC<3,N>. The region R4w includes the memory cells MC<4,0> to MC<4,N>.

The regions R0w to R4w are arranged in the order of region R4w, region R3w, region R2w, region R1w, and region R0w from the column selection circuit 15 side. As a region including a memory cell MC is nearer to the column selection circuit 15 (hereinafter, such a memory cell MC will also be referred to as a "cell near to the column selection circuit 15"), the length of the bit line BL between the memory cell MC in the region and the column selection circuit 15 becomes smaller. A region near to the column selection circuit 15 is, for example, the region R4w. In other words, as a region including a memory cell MC is farther from the column selection circuit 15 (hereinafter, such a memory cell MC will also be referred to as a "cell far from the column selection circuit 15"), the length of the bit line BL between the memory cell MC in the region and the column selection circuit 15 becomes greater. A region far from the column selection circuit 15 is, for example, the region R0w. Therefore, as a memory cell MC is nearer to the column selection circuit 15, the resistance value of the bit line BL between the memory cell MC and the column selection circuit 15 becomes lower.

Each of the bit lines BL is coupled to the column selection circuit 15 and the plurality of memory cells MC arranged in the Y direction. The column selection circuit 15 supplies the write current to the memory cells MC via the bit lines BL. In the following, regions including the plurality of memory cells MC coupled to each of the bit lines BL<0> to BL<4> will be referred to as regions R0b to R4b. The region R0b includes the memory cells MC<0,0> to MC<M,0>. The region R1b includes the memory cells MC<0,1> to MC<M,1>. The region R2b includes the memory cells MC<0,2> to MC<M,2>. The region R3b includes the memory cells MC<0,3> to MC<M,3>. The region R4b includes the memory cells MC<0,4> to MC<M,4>.

The regions R0b to R4b are arranged in the order of region R0b, region R1b, region R2b, region R3b, and region R4b from the row selection circuit 14 side. As a region including a memory cell MC is nearer to the row selection circuit 14 (hereinafter, such a memory cell MC will also be referred to as a "cell near to the row selection circuit 14"), the length of the word line WL between the memory cell MC in the region and the row selection circuit 14 becomes smaller. A region near to the row selection circuit 14 is, for example, the region R0b. In other words, As a region including a memory cell MC is farther from the row selection circuit 14 (hereinafter, such a memory cell MC will also be referred to as a "cell far from the row selection circuit 14"), the length of the word line WL between the memory cell MC in the region and the row selection circuit 14 becomes greater. A region far from the row selection circuit 14 is, for example, the region R4b. Therefore, as a memory cell MC is nearer to the row selection circuit 14, the resistance value of the word line WL between the memory cell MC and the row selection circuit 14 becomes lower.

(Cross-Sectional Structure)

Figure 4:
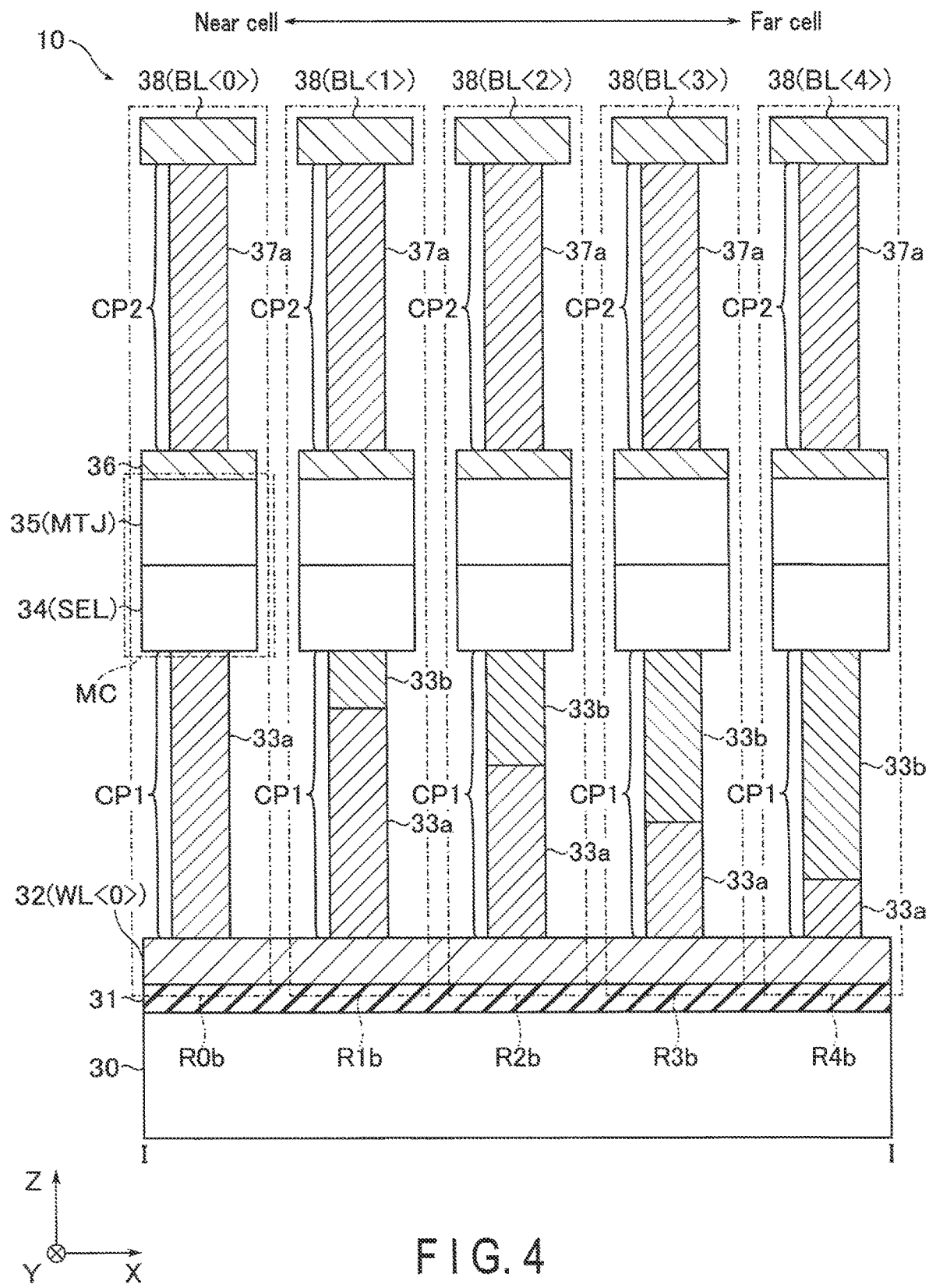
FIG. 4 is a cross-sectional view showing one example of a cross-sectional structure of the memory cell array included in the memory device according to the first embodiment.
Figure 5:
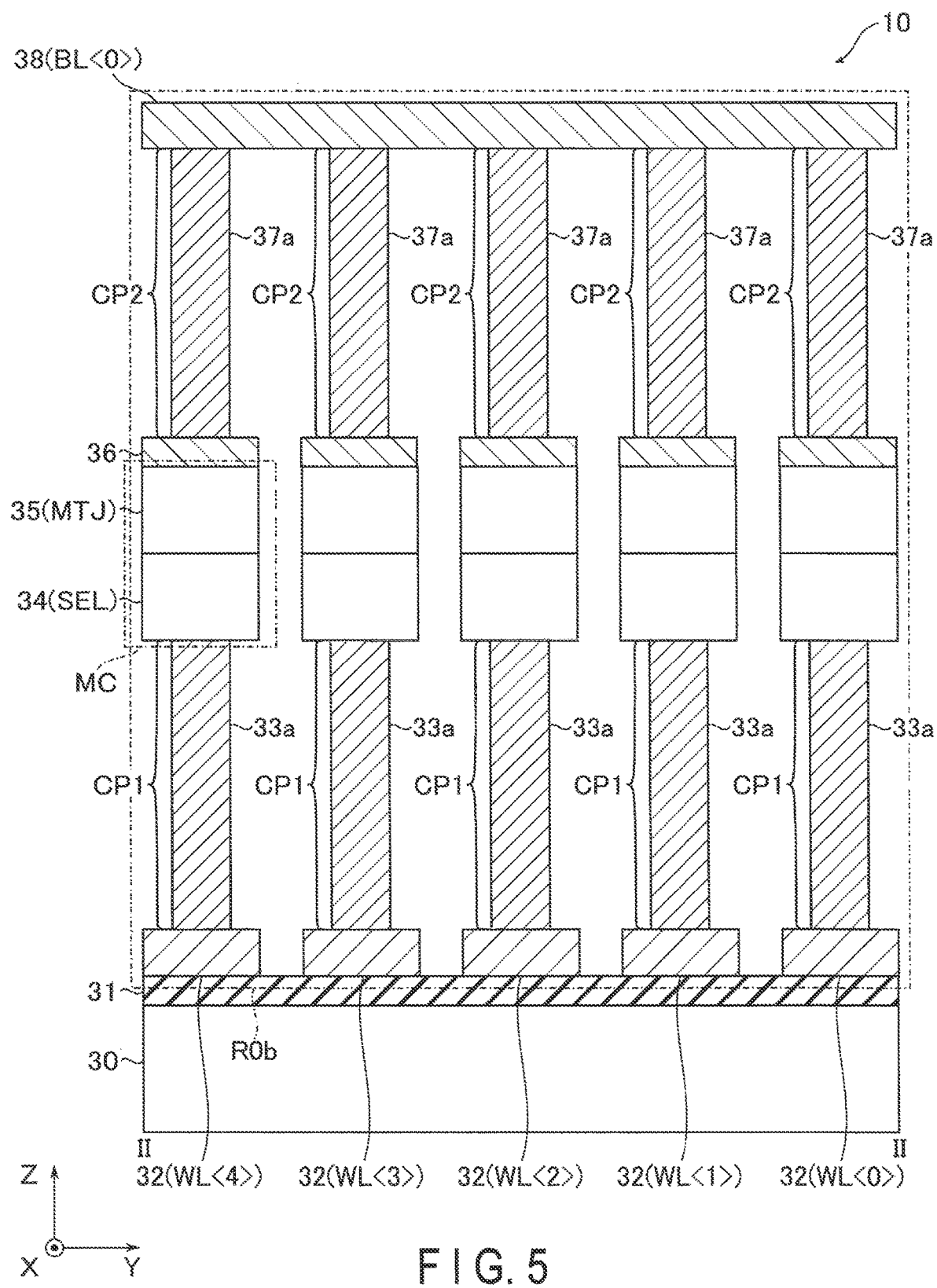
FIG. 5 is a cross-sectional view showing one example of a cross-sectional structure of the memory cell array included in the memory device according to the first embodiment.

A cross-sectional structure of the memory cell array 10 will be described with reference to in FIG. 4 to FIG. 6. FIG. 4 is a cross-sectional view taken along line I-I of FIG. 3. FIG. 5 is a cross-sectional view taken along line II-II of FIG. 3. FIG. 6 is a perspective view of part of the memory cell array 10. The examples shown in FIG. 4 to FIG. 6 omit the insulating layer.

As shown in FIG. 4 to FIG. 6, the memory cell array 10 is provided above a semiconductor substrate 30.

A plurality of conductors 32 are provided above the semiconductor substrate 30, for example, with the insulating layer 31 intervening therebetween. The plurality of conductors 32 are formed of a conductive material and function as the word lines WL. The plurality of conductors 32 are provided side by side in the Y direction, for example, and each extend in the X direction. FIG. 6 omits the semiconductor substrate 30 and the insulating layer 31.

A plurality of contact plugs CP1 (hereinafter, also referred to as "first electrodes" or "bottom electrodes") are provided on the upper surface of the single conductor 32. The contact plugs CP1 electrically couple the memory cells MC to the conductor 32. The plurality of contact plugs CP1 provided on the upper surface of the single conductor 32 are provided side by side in the X direction, for example.

The contact plug CP1 (bottom electrode) in the region R0b includes a conductor 33a. Each of the contact plugs CP1 in the regions R1b to R4b includes conductors 33a and 33b. Each of the conductors 33a and 33b is formed of a conductive material. The conductor 33b includes a material lower in resistivity than the conductor 33a. The conductors 33a and 33b may include, for example, carbon, boron nitride (BN), metal oxide, metal nitride, polycrystalline silicon (poly-Si), tungsten, titanium, aluminium, copper, etc. For example, two of these materials are selected, and the conductor 33a includes one of these two selected materials that is higher in resistivity than the other (hereinafter, also referred to as a "high resistance material"). The conductor 33b includes one of these two selected materials that is lower in resistivity than the other (hereinafter, also referred to as a "low resistance material"). The conductors 33a and 33b are not limited to the aforementioned materials as long as the conductor 33a is higher in resistivity than the conductor 33b.

The high resistance material used for the conductor 33a and the low resistance material used for the conductor 33b may be selected as described below. When at least one of copper and aluminum is selected as the low resistance material, at least one of tungsten, tungsten nitride (WN), titanium, titanium nitride (TiN), carbon, and polycrystalline silicon may be selected as the high resistance material. When at least one of tungsten, tungsten nitride, titanium, and titanium nitride is selected as the low resistance material, at least one of carbon and polycrystalline silicon may be selected as the high resistance material. When carbon is selected as the low resistance material, polycrystalline silicon may be selected as the high resistance material.

The contact plugs CP1 in the regions R0b to R4b are substantially equal in diameter. The cross-sectional shape (shape of the XY cross section) of each contact plug CP1 is not limited to a circular shape. For example, the cross-sectional shape of each contact plug CP1 may be ellipsoidal or rectangular. Regardless of what cross-sectional shape of the contact plugs CP1 take, the contact plugs CP1 in the regions R0b to R4b are substantially equal in terms of area (contact area) in which the contact plug CP1 is in contact with the word line WL.

With respect to the contact plugs CP1 in the regions R1b to R4b, as a region provided with the contact plug CP1 is nearer to the row selection circuit 14, the ratio of the conductor 33b included in the contact plug CP1 becomes lower. With respect to the contact plugs CP1 in the regions R1b to R4b, as a region provided with the contact plug CP1 is nearer to the row selection circuit 14, the height of the conductor 33b included in the contact plug CP1 becomes lower. Therefore, as a region provided with the contact plug CP1 is nearer to the row selection circuit 14, the resistance value of the contact plug CP1 becomes higher.

The length of the word line WL from the row selection circuit 14 to the contact plug CP1 provided in the region R0b is smaller than the length of the word line WL from the row selection circuit 14 to the contact plug CP1 provided in the region R1b. The length of the word line WL from the row selection circuit 14 to the contact plug CP1 provided in the region R1b is smaller than the length of the word line WL from the row selection circuit 14 to the contact plug CP1 provided in the region R2b. The same applies to the subsequent regions.

The conductor 33b is provided on the conductor 33a. The conductor 33a may be provided on the conductor 33b. Each of the contact plugs CP1 in the regions R1b to R4b may be formed of three or more conductors each having different resistivity.

The conductors 33a and 33b may include two or more materials. For example, when each of the conductors 33a and 33b includes two materials A and B of different resistivities, the ratio of the material A and the material B included in the conductor 33a may be different from the ratio of the material A and the material. B included in the conductor 33b. The conductor 33a and the conductor 33b may have different resistivities in this manner.

An element 34 is provided on the upper surface of the contact plug CP1. The element. 34 functions as a switching element SEL.

An element 35 is provided on the upper surface of the element 34. The element 35 functions as a magnetoresistance effect element MTJ. The configuration of the element 35 will be described later in detail.

A conductor 36 is provided on the upper surface of the element 35. The conductor 36 is formed of a conductive material and functions as a hard mask for use in processing of the element 35.

A contact plug CP2 (hereinafter, also referred to as a "second electrode" or a "top electrode") is provided on the upper surface of the conductor 36. The contact plug CP2 (top electrode) electrically couples the memory cell MC to a conductor 38 to be described later with the conductor 36 intervening therebetween. The contact plug CP2 includes a conductor 37a. The conductor 37a is formed of a conductive material.

The conductor 38 is provided on the upper surface of the contact plug CP2. The plurality of conductors 38 are formed from a conductive material and function as the bit lines BL. The plurality of conductors 38 are provided side by side in the X direction, for example, and each extend in the Y direction. For example, the plurality of contact plugs CP2 provided side by side in the Y direction are coupled to the single conductor 38.

As shown in FIG. 6, each intersection between the conductor 32 and the conductor 38 is provided with the single memory cell MC.

The element 34 and the element 35 may not be provided in such a manner as to be in contact with each other. For example, the element 34 and the element 35 may be electrically coupled to each other with a conductor (not shown) intervening therebetween. The above description with reference to FIG. 4 to FIG. 6 was given to the case in which the element 35 and the conductor 36 are provided above the element 34; however, this is not a limitation. For example, the element 34 may be provided above the element 35 and the conductor 36.

The memory cell array 10 thus configured has a configuration in which the memory cell MC is provided between the corresponding word line WL and bit line BL.

The above description with reference to FIG. 3 to FIG. 6 applies to a configuration (referred to as a "single-layered structure") in which one memory cell MC is selectable according to a pair of one word line WL and one bit line BL; however, this is not a limitation. For example, a given array structure such as a structure in which a plurality of structures described above are stacked in the Z direction is also applicable.

While FIG. 6 illustrates a structure where the contact plugs CP1 and CP2 each have a diameter smaller than that of the memory cell MC, this is one exemplary structure and poses no limitation. Comparable effects are also attainable with structures where, for example, the contact plugs CP1 and CP2 and the memory cell MC are substantially equal in diameter.

1.1.4 Structure of Magnetoresistance Effect Element

Figure 7:
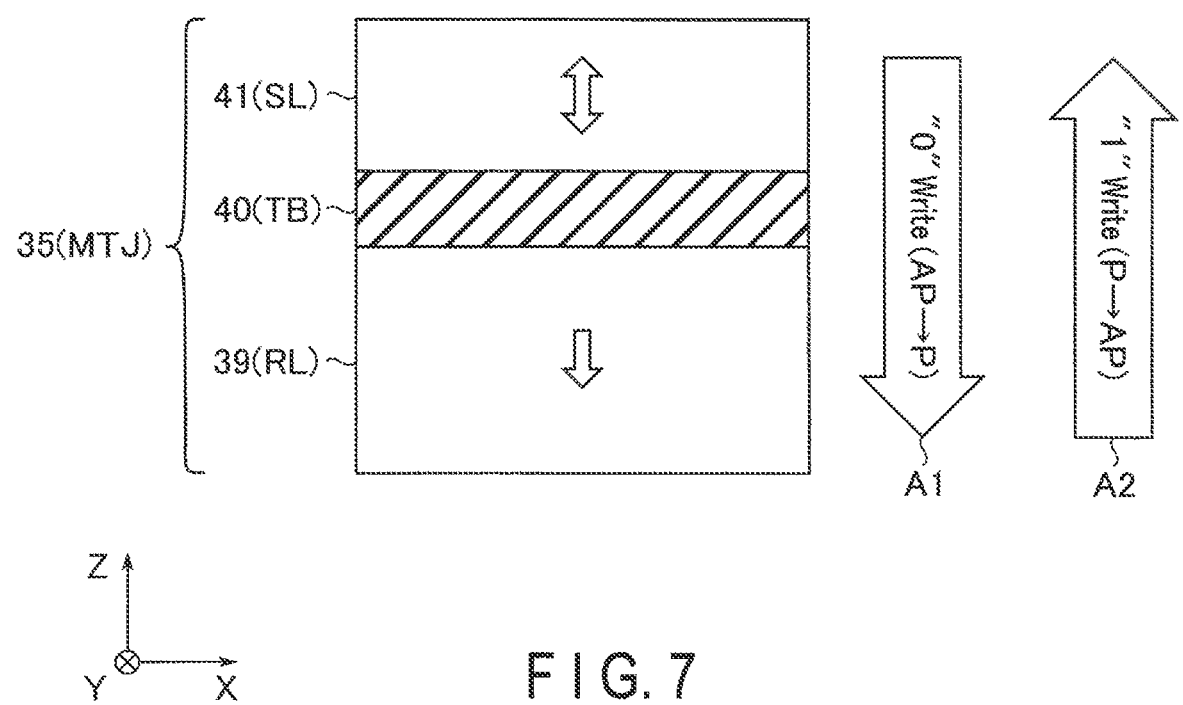
FIG. 7 is a cross-sectional view showing one example of a cross-sectional structure of a magnetoresistance effect element included in the memory device according to the first embodiment.

A structure of the magnetoresistance effect element MTJ will be described with reference to FIG. 7. FIG. 7 is a cross-sectional view showing one example of a cross-sectional structure of the magnetoresistance effect element MTJ.

As shown in FIG. 7, each of the elements 35 (magnetoresistance effect elements MTJ) includes a ferromagnet 39 functioning as a reference layer RL, a nonmagnet 40 functioning as a tunnel barrier layer TB, and a ferromagnet 41 functioning as a storage layer SL.

In each of the magnetoresistance effect elements MTJ, a plurality of materials, for example, the ferromagnet 39, the nonmagnet 40, and the ferromagnet 41 are stacked in this order, from the word line WL side toward the bit line BL side (in the direction of the Z axis). The magnetoresistance effect element MTJ functions as, for example, a perpendicular-magnetization type magnetoresistance effect element MTJ in which each of the magnetization directions of the magnetic materials that constitute magnetoresistance effect element MTJ is oriented in a perpendicular direction with respect to a film surface.

The ferromagnet 39 has ferromagnetic properties, and has an easy axis of magnetization in a direction perpendicular to the film surface. The ferromagnet 39 has a magnetization direction oriented to the bit line BL side or the word line WL side. The ferromagnet 39 includes, for example, cobalt-iron-boron (CoFeB) or iron boron (FeB). The magnetization direction of the ferromagnet 39 is fixed. In the example of FIG. 7, the magnetization direction is oriented to the surface opposite to the surface on which the nonmagnet 40 is provided. The "magnetization direction" being "fixed" means that the magnetization direction is not changed by a current (spin torque) of a magnitude such that the magnetization direction of the ferromagnet 41 is inverted.

The nonmagnet 40 is a non-magnetic insulating film, and includes magnesium oxide (MgO), for example. The nonmagnet 40 is provided between the ferromagnet 39 and the ferromagnet 41. With this configuration, the ferromagnet 39, the nonmagnet 40, and the ferromagnet 41 constitute a magnetic tunnel junction.

The ferromagnet 41 has ferromagnetic properties, and has an easy axis of magnetization in a direction perpendicular to the film surface. The ferromagnet 41 has a magnetization direction oriented to the bit line BL side or the word line WL side. The ferromagnet 41 includes, for example, cobalt-iron-boron (CoFeB) or iron boride (FeB), and may have a crystalline structure of a body-centered cubic (bcc) type.

For example, the memory device 1 supplies the write current directly to such a magnetoresistance effect element MTJ configured as described above, injects spin torque into the storage layer SL and the reference layer RL by this write current, and controls the magnetization direction of the storage layer SL and the magnetization direction of the reference layer RL. This writing method is also called spin injection writing. The magnetoresistance effect element MTJ can take either a low-resistance state or a high-resistance state, depending on whether the relative relationship between the magnetization directions of the storage layer SL and the reference layer RL is parallel or anti-parallel.

When a write current Tw0 of a certain magnitude is applied to the magnetoresistance effect element MTJ in the direction indicated by an arrow A1 in FIG. 7, i.e., the direction from the storage layer SL to the reference layer RL, the relative relationship between the magnetization directions of the storage layer SL and the reference layer RL becomes parallel. In this parallel state, the resistance value of the magnetoresistance effect element MTJ takes the minimum value, and the magnetoresistance effect element MTJ is set to a low-resistance state. This low-resistance state is called a "parallel (P) state", and is defined as, for example, a state of data "0".

When a write current Iw1 larger than the write current Iw0 is applied to the magnetoresistance effect element MTJ in the direction indicated by an arrow A2 in FIG. 7, i.e., the direction from the reference layer RL to the storage layer SL, the relative relationship between the magnetization directions of the storage layer SL and the reference layer RL becomes anti-parallel. In this anti-parallel state, the resistance value of the magnetoresistance effect element MTJ takes the maximum value, and the magnetoresistance effect element MTJ is set to a high-resistance state. This high-resistance state is called "anti-parallel (AP) state", and is defined as, for example, a state of data "1".

However, the way of defining data "1" and data "0" is not limited to the example described above. For example, the P state may be defined as data "1", and the AP state may be defined as data "0".

1.2 Method of Manufacturing Memory Device

Figure 8:
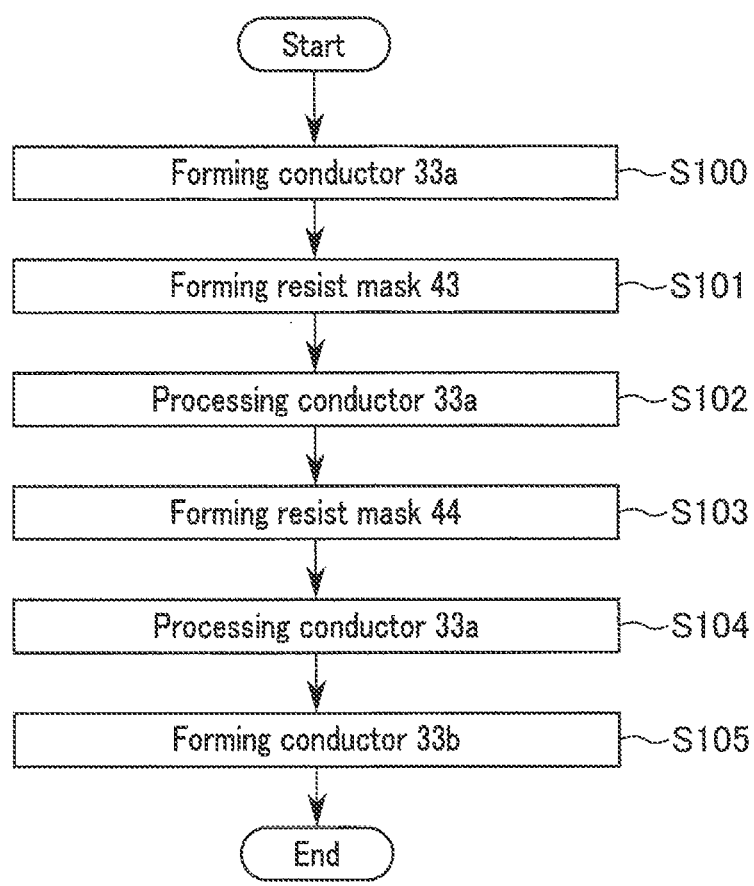
FIG. 8 is a flowchart showing one example of a method of manufacturing the memory device according to the first embodiment.

A method of manufacturing the memory device 1 according to the first embodiment will be described with reference to FIG. 8 to FIG. 14. FIG. 8 is a flowchart showing one example of the method of manufacturing of the contact plug CP1 in the memory device 1. FIG. 9 to FIG. 14 are each a cross-sectional view showing one example of a cross-sectional structure during a process of manufacturing the memory device 1. The following will describe an exemplary case in which the contact plugs CP1 in the regions R0b to R2b in FIG. 4 are formed. FIG. 9 to FIG. 14 each show the contact plugs CP1 in the regions R0b to R2b in FIG. 4. FIG. 9 to FIG. 14 each omit the semiconductor substrate 30, the insulating layer 31, the element 34, the element 35, the conductor 36, the contact plug CP2, and the conductor 38.

As shown in FIG. 8, steps S100 to S105 are sequentially executed during the process of manufacturing the contact plugs CP1. An exemplary process of manufacturing the contact plugs CP1 will be described below by suitably referring to FIG. 8.

Figure 9:
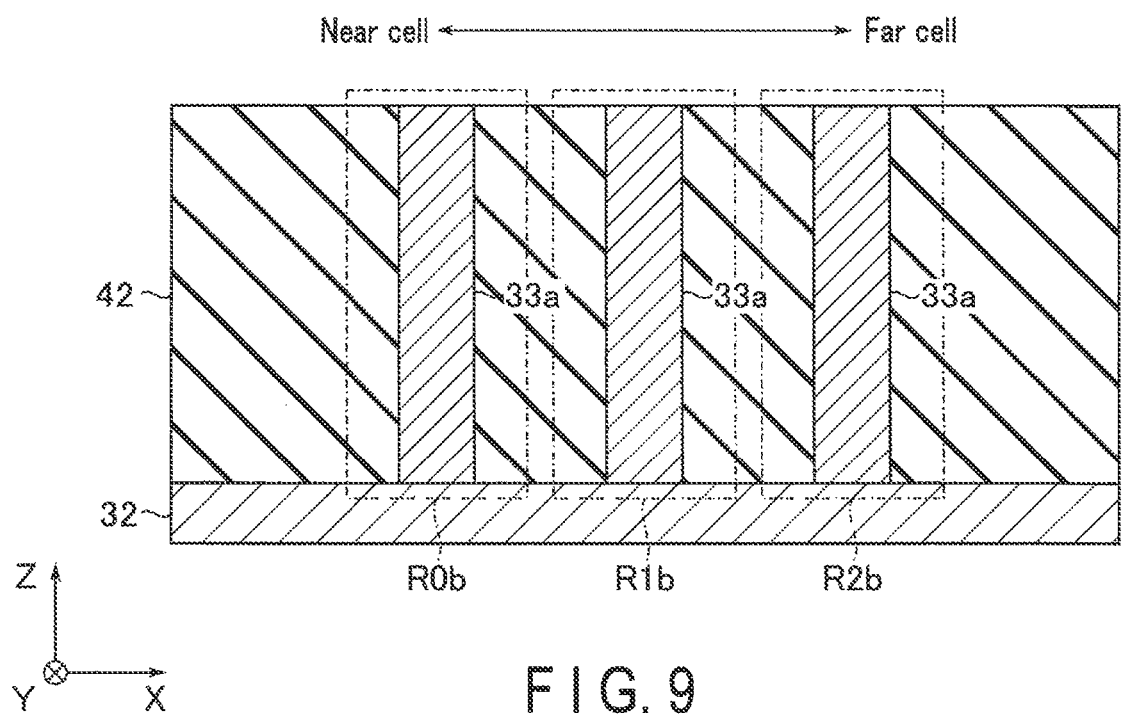
FIG. 9 is a cross-sectional view showing one example of a cross-sectional structure during a process of manufacturing the memory device according to the first embodiment.

First, as shown in FIG. 9, the conductors 33a that penetrate the insulating layer 42 and have the bottom surfaces reaching the conductor 32 are formed (S100). More specifically, holes that penetrate the insulating layer 42 and have the bottom surfaces reaching the conductor 32 are formed. The holes correspond to the contact plugs CP1. Next, a layer of the conductors 33a is formed in such a manner as to fill the holes. Thereafter, the conductor 33a on the insulating layer 42 is removed by, e.g., chemical mechanical polishing (CMP).

Figure 10:
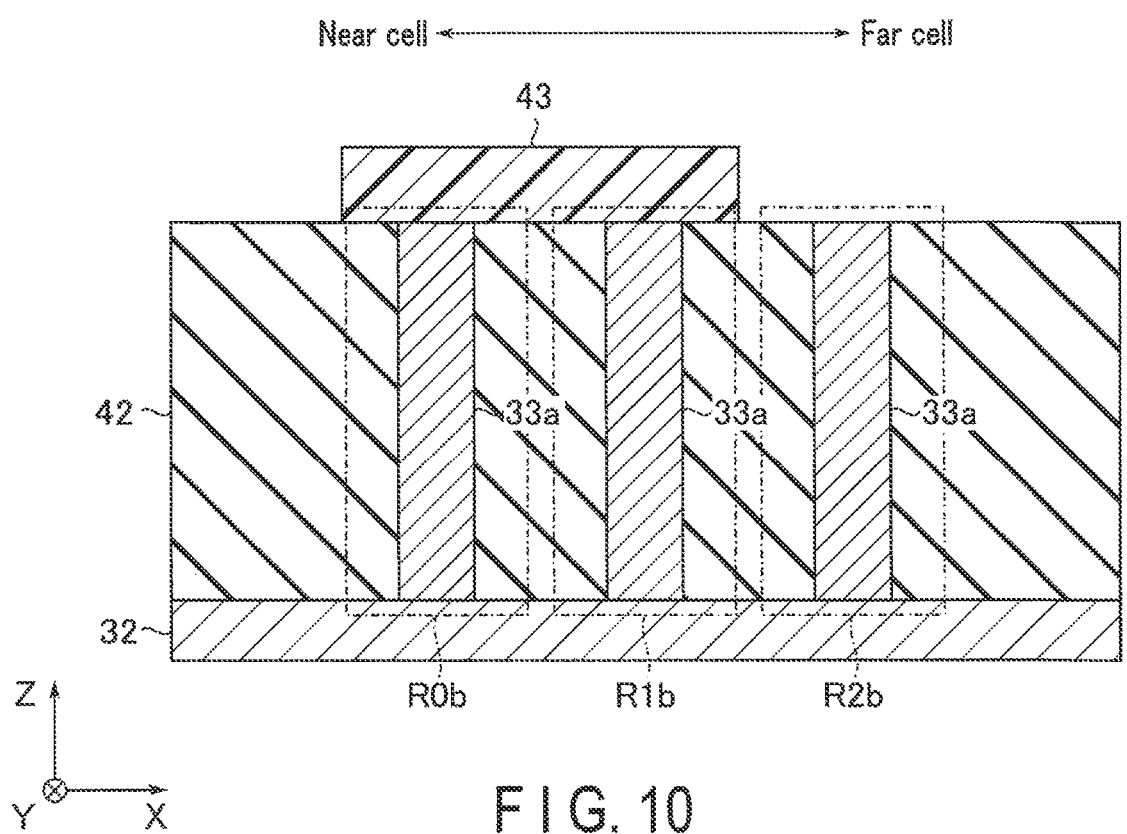
FIG. 10 is a cross-sectional view showing one example of a cross-sectional structure during a process of manufacturing the memory device according to the first embodiment.

Next, as shown in FIG. 10, a resist mask 43 for processing the conductor 33a in the region R2b is formed on the conductors 33a and the insulating layer 42 by photolithography, etc. (S101). An opening of the resist mask 43 is formed in the region R2b. Thus, the upper surface of the conductor 33a provided in the region R2b is exposed (is not covered with the resist mask 43). The upper surfaces of the conductors 33a provided in the regions R0b and R1b are covered with the resist mask 43.

Figure 11:
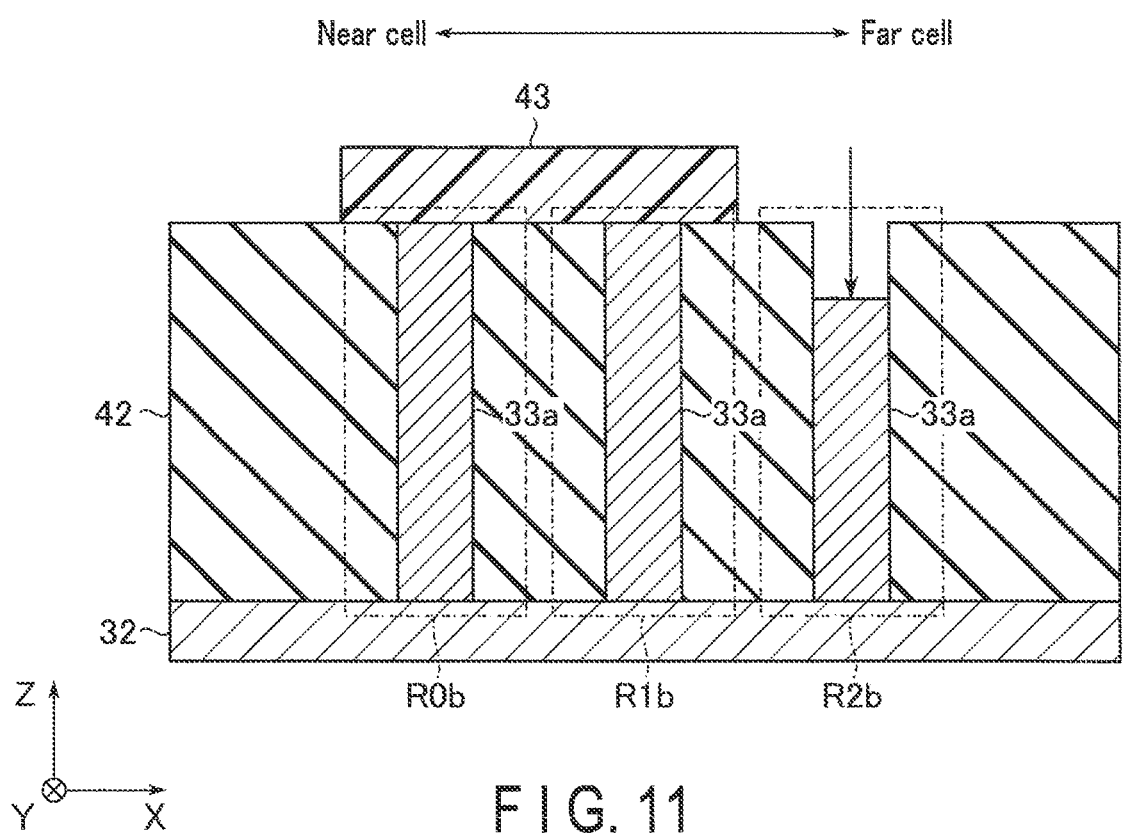
FIG. 11 is a cross-sectional view showing one example of a cross-sectional structure during a process of manufacturing the memory device according to the first embodiment.

Next, as shown in FIG. 11, the conductor 33a is processed by, for example, reactive ion etching (RIE) (S102). The upper portion of the conductor 33a in the region R2b is removed through S102. The upper surface of the conductor 33a in the region R2b is positioned below the upper surface of the insulating layer 42. The conductor 33a may be processed by wet etching. After the conductor 33a is processed, the resist mask 43 is peeled.

Figure 12:
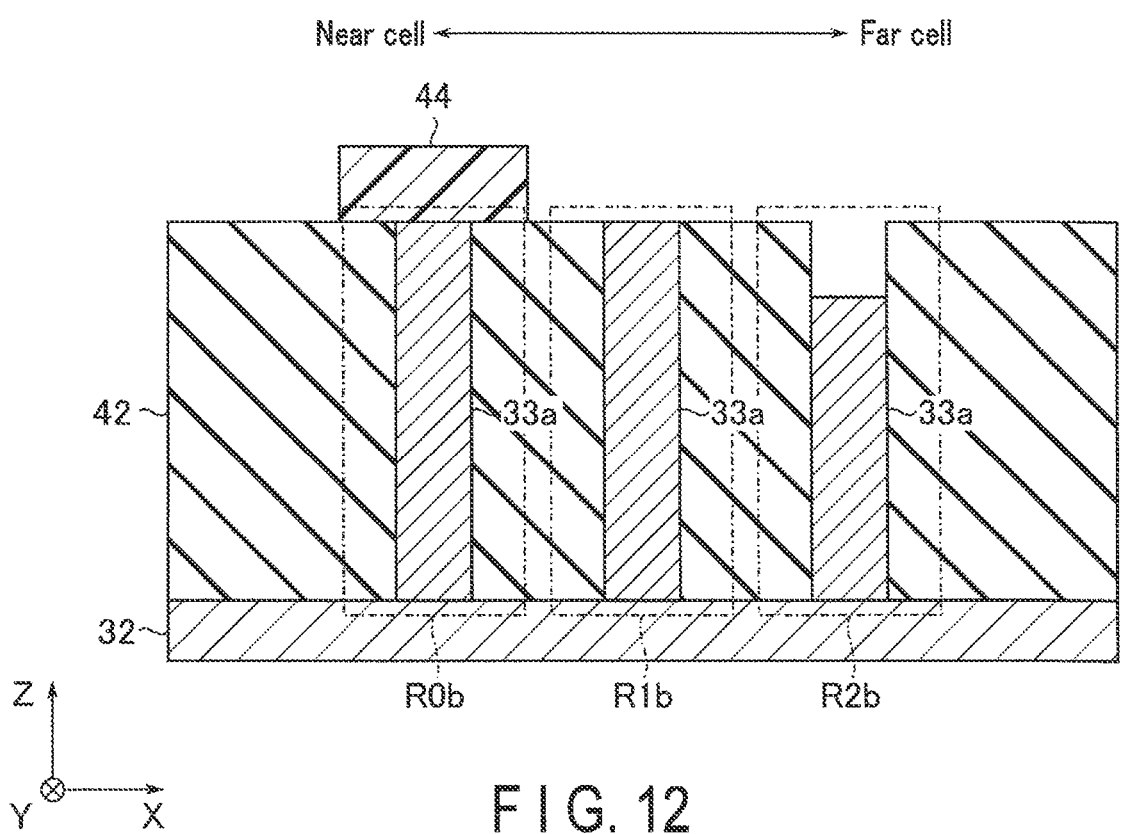
FIG. 12 is a cross-sectional view showing one example of a cross-sectional structure during a process of manufacturing the memory device according to the first embodiment.

Next, as shown in FIG. 12, a resist mask 44 for processing the conductor 33a in the region R2b and the conductor 33a in the region R1b is formed on the conductor 33a and the insulating layer 42 by photolithography, etc. (S103). An opening of the resist mask 44 is formed in the regions R1b and R2b. Thus, the upper surfaces of the conductors 33a provided in the regions R1b and R2b are exposed (are not covered with the resist mask 44). The upper surface of the conductor 33a provided in the region R0b is covered with the resist mask 44.

Figure 13:
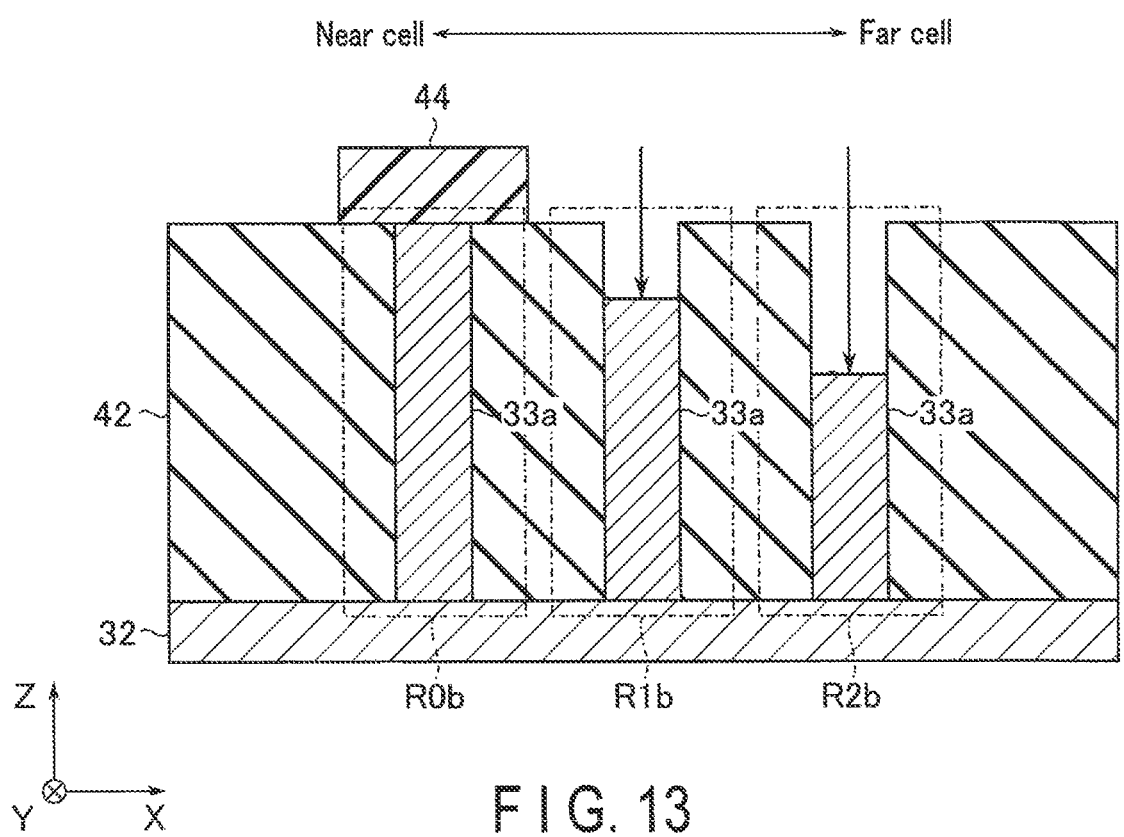
FIG. 13 is a cross-sectional view showing one example of a cross-sectional structure during a process of manufacturing the memory device according to the first embodiment.

Next, as shown in FIG. 13, the conductors 33a are processed by, for example, RIE (S104). The upper portion of each of the conductor 33a in the region R2b and the conductor 33a in the region R1b is removed through S104. The upper surface of the conductor 33a in the region R1b is positioned below the upper surface of the insulating layer 42. The upper surface of the conductor 33a in the region R2b is positioned below the upper surface of the conductor 33a in the region R1b. That is, the conductor 33a in the region R2b is shaved more than the conductor 33a in the region R1b through S102 and S104. The conductor 33a may be processed by wet etching. After the conductor 33a is processed, the resist mask 44 is peeled.

Figure 14:
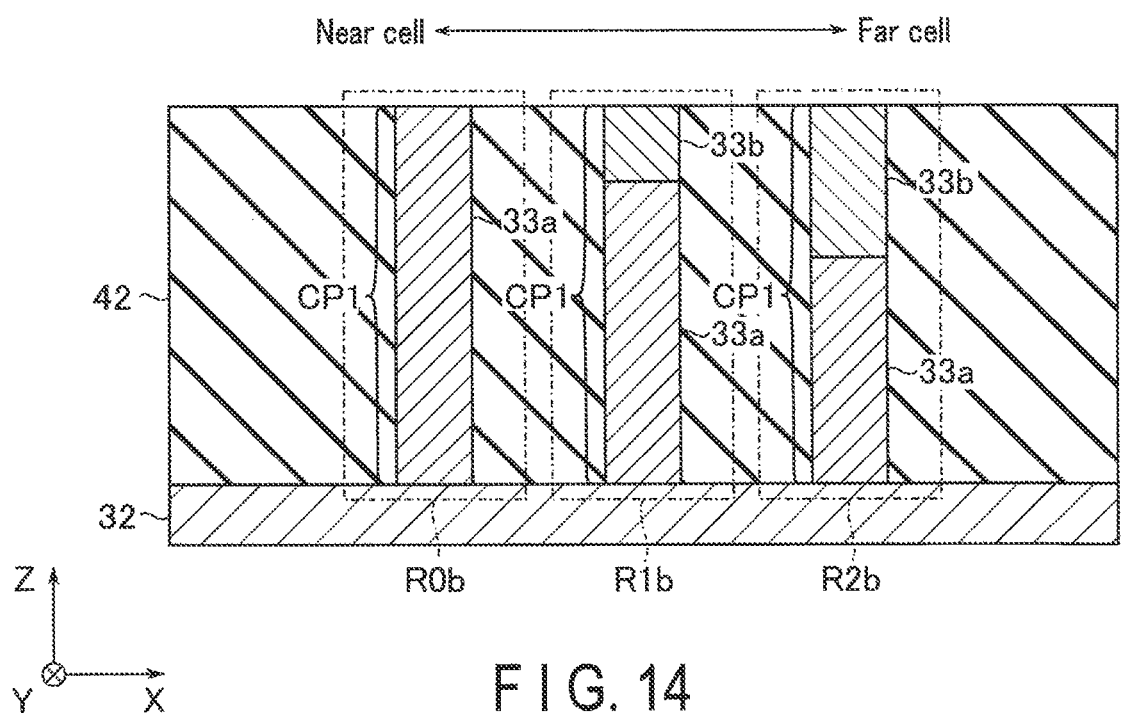
FIG. 14 is a cross-sectional view showing one example of a cross-sectional structure during a process of manufacturing the memory device according to the first embodiment.

Next, as shown in FIG. 14, the conductors 33b are formed on the conductor 33a in the region R2b and the conductor 33a in the region R1b (S105). More specifically, a layer of the conductors 33b is formed in such a manner as to fill the regions from which the conductors 33a have been removed through S102 and S104. Thereafter, the conductor 33b on the insulating layer 42 is removed by CMP, etc.

Generally in many cases, a material relatively high in resistivity has a higher affinity for RIE than a material relatively low in resistivity. Thus, it is preferable that the conductor 33a be arranged below the conductor 33b.

In the case of k bit lines BL (where k is an integer greater than or equal to 1), the photolithography and RIE for varying the ratio of the conductor 33b are repeated (k−1) times.

Through the manufacturing process described in the above, the contact plugs CP1 are formed. The manufacturing process described in the above is merely one example and is not limited thereto. For example, another step may be inserted between the respective manufacturing steps or part of the steps may be omitted or integrated. Furthermore, the respective manufacturing steps may be interchanged where possible.

1.3 Advantageous Effect of Present Embodiment

According to the first embodiment, misreading can be reduced. This advantageous effect will be described below.

As described above, as a memory cell MC is nearer to the row selection circuit 14, the resistance value of the word line WL between the memory cell MC and the row selection circuit 14 becomes lower. It is assumed that the plurality of contact plugs CP1 coupled to the word line WL are equal in terms of resistance value. In this case, the resistance value of a wiring path including the word line WL and the contact plug CP1 from the row selection circuit 14 to the memory cell MC (hereinafter, also referred to as a "row selection circuit-intercell wiring path") varies depending on the length of the word line WL from the row selection circuit 14 to the contact plug CP1. A time period from when driving of the write driver 19 is started to when the element 34 (switching element SEL) of the memory cell MC transitions to the ON state varies in accordance with the resistance value of the row selection circuit-intercell wiring path. Thus, the length of the time period during which the write driver 19 supplies a write current to the memory cell MC (hereinafter, also referred to as a "current supplying time period") varies in accordance with the length of the word line WL.

The current supplying time period is longer in a cell nearer to the row selection circuit 14 and is shorter in a cell farther from the row selection circuit 14. In a memory cell MC in which the current supplying time period is relatively short, namely, a cell far from the row selection circuit 14, a write error may occur due to the insufficient current supplying time period. On the other hand, in a memory cell MC in which the current supplying time period is relatively long, namely, a cell near to the row selection circuit 14, a breakdown error of the magnetoresistance effect element MTJ may occur due to the excessive current supplying time period.

For this reason, the present embodiment varies the resistance value of the contact plug CP1 depending on the length of the word line WL from the row selection circuit 14 to the contact plug CP1. In other words, the resistance value of the contact plug CP1 differs in accordance with the arrangement of the row selection circuit 14 and the memory cell MC.

More specifically, the contact plug CP1 in the region R0b includes the conductor 33a. Each of the contact plugs CP1 in the regions R1b to R4b includes the conductor 33a and the conductor 33b lower in resistivity than the conductor 33a. The ratio of the conductor 33b included in the contact plug CP1 is set to be lower in the contact plug CP1 provided in a region nearer to the row selection circuit 14. In this manner, as a region provided with the contact plug CP1 is nearer to the row selection circuit 14, the resistance value of the contact plug CP1 becomes higher. Thus, the resistance value of the word line WL is lower and the resistance value of the contact plug CP1 is higher in a region near to the row selection circuit 14 as compared to those values in a farther region. On the other hand, the resistance value of the word line WL is higher and the resistance value of the contact plug CP1 is lower in a region far from the row selection circuit 14 as compared to those values in a nearer region. As described above, the variation in resistance value of the row selection circuit-intercell wiring path due to the length of the word line WL can be suppressed by combining the aforementioned resistance value of the word line WL with the resistance value of the contact plug CP1. Accordingly, misreading of data can be reduced.

1.4 First Modification

A memory device according to a first modification of the first embodiment will be described. The memory device 1 according to the first modification of the first embodiment differs from that of the first embodiment in terms of how the ratio of the conductor 33b included in the contact plug CP1 is assigned. In the following description, the description of similar configurations to those of the first embodiment will be omitted, and the configurations different from those of the first embodiment will be mainly described.

1.4.1 Structure of Memory Cell Array

The structure of the memory cell array 10 is similar to that of the first embodiment.

Figure 15:
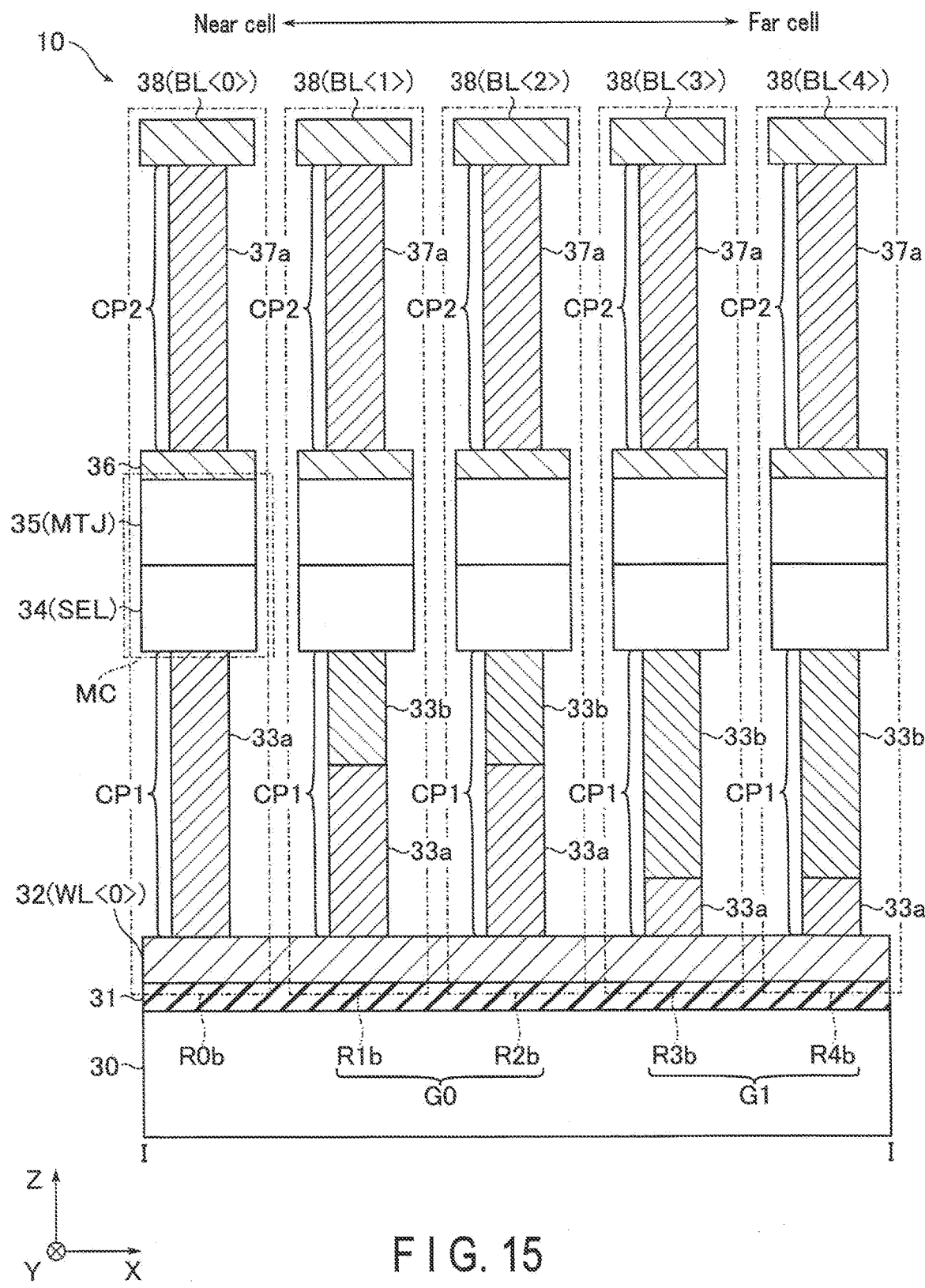
FIG. 15 is a cross-sectional view showing one example of a cross-sectional structure of a memory cell array included in a memory device according to a first modification of the first embodiment.

A cross-sectional structure of the memory cell array 10 will be described with reference to FIG. 15. FIG. 15 is a cross-sectional view taken along line I-I of FIG. 3. The example shown in FIG. 15 omits the insulating layer.

As shown in FIG. 15, the contact plugs CP1 in the regions R0b to R4b are substantially equal in diameter. The cross-sectional shape of each contact plug CP1 is not limited to a circular shape. Regardless of what cross-sectional shape the contact plugs CP1 take, the contact plugs CP1 in the regions R0b to R4b are substantially equal in terms of area in which the contact plug CP1 is in contact with the word line WL.

The regions R1b to R4b are divided into a group G0 including the two regions R1b and R2b adjacent to each other and a group G1 including the two regions R3b and R4b adjacent to each other. The contact plugs CP1 in the regions R1b and R2b are equal in terms of ratio of the conductor 33b included in the contact plug CP1. The contact plugs CP1 in the regions R3b and R4b are equal in terms of ratio of the conductor 33b included in the contact plug CP1. The ratio of the conductor 33b included in each of the contact plugs CP1 in the regions R1b and R2b is lower than the ratio of the conductor 33b included in each of the contact plugs CP1 in the regions R3b and R4b. With respect to the contact plugs CP1 in the groups G0 and G1, as a group provided with the contact plug CP1 is nearer to the row selection circuit 14, the ratio of the conductor 33b included in the contact plug CP1 in the group becomes lower. With respect to the conductor 33b included in each of the contact plugs CP1 in the groups G0 and G1, as a group provided with the contact plug CP1 is nearer to the row selection circuit 14, the height of the conductor 33b included in the contact plug CP1 in the group becomes lower. Thus, as a group provided with the contact plug CP1 is nearer to the row selection circuit 14, the resistance value of the contact plug CP1 becomes higher. The above description with reference to FIG. 15 was given for the case in which each group includes two regions adjacent to each other; however, this is not a limitation. For example, each group may include three or more regions adjacent to each other. Furthermore, the number of regions included in each group may differ between groups.

The remainder of the cross-sectional structure of the memory cell array 10 is similar to that of the first embodiment.

1.4.2 Advantageous Effect of Present Modification

The present modification produces the advantageous effects similar to those of the first embodiment.

According to the present modification, the ratio of the conductor 33b included in the contact plug CP1 differs between the groups. This eliminates the need to vary the ratio of the conductor 33b included in the contact plug CP1 between the regions R1b to R4b. This reduces the variety of contact plugs CP1 differing in ratio of the conductor 33b as compared to the case in which the ratios of the conductors 33b included in the contact plug CP1 are changed individually. This can decrease the number of times the photolithography and RIE for varying the ratio of the conductor 33b are repeated. Thus, a process cost can be reduced.

1.5 Second Modification

A memory device according to a second modification of the first embodiment will be described. The memory device 1 according to the second modification of the first embodiment differs from that of the first embodiment in terms of material of the conductors 33a and 33b included in the contact plug CP1. In the following description, the description of similar configurations to those of the first embodiment will be omitted, and the configurations different from those of the first embodiment will be mainly described.

1.5.1 Structure of Memory Cell Array

The planer structure and the cross-sectional structure of the memory cell array 10 are similar to those of the first embodiment.

In FIG. 4, the conductors 33a and 33b are, for example, an n-type semiconductor or a p-type semiconductor. The conductors 33a and 33b include at least one of silicon and germanium, for example. The conductors 33a and 33b include an impurity (dopant). The impurity is, for example, boron, phosphorus, arsenic, or antimony. The conductor 33b is higher in impurity concentration than the conductor 33a. That is, the conductor 33b is lower in resistivity than the conductor 33a. Therefore, as a region provided with the contact plug CP1 is nearer to the row selection circuit 14, the resistance value of the contact plug CP1 becomes higher.

1.5.2 Method of Manufacturing Memory Device

Figure 16:
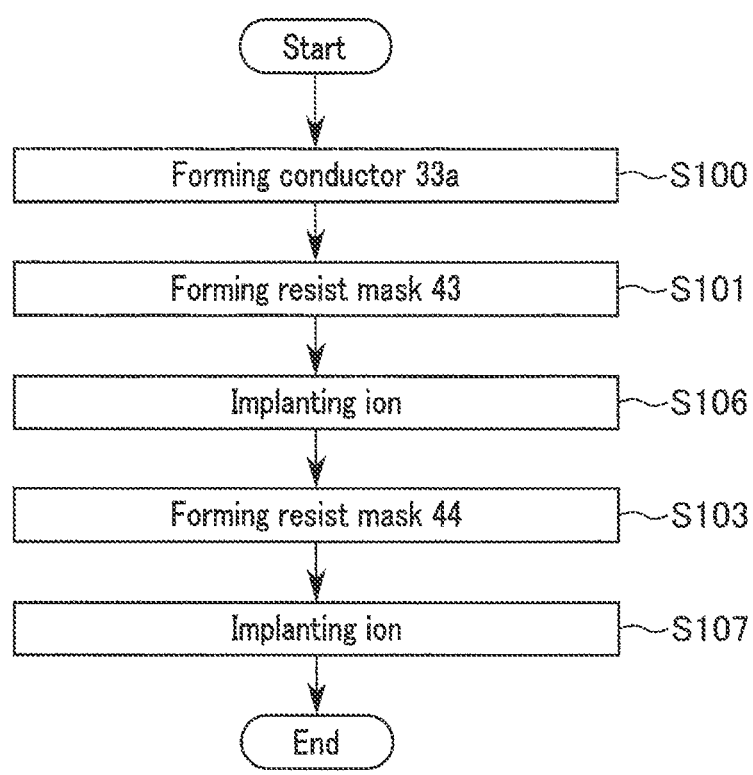
FIG. 16 is a flowchart showing one example of a method of manufacturing a memory device according to a second modification of the first embodiment.
Figure 17:
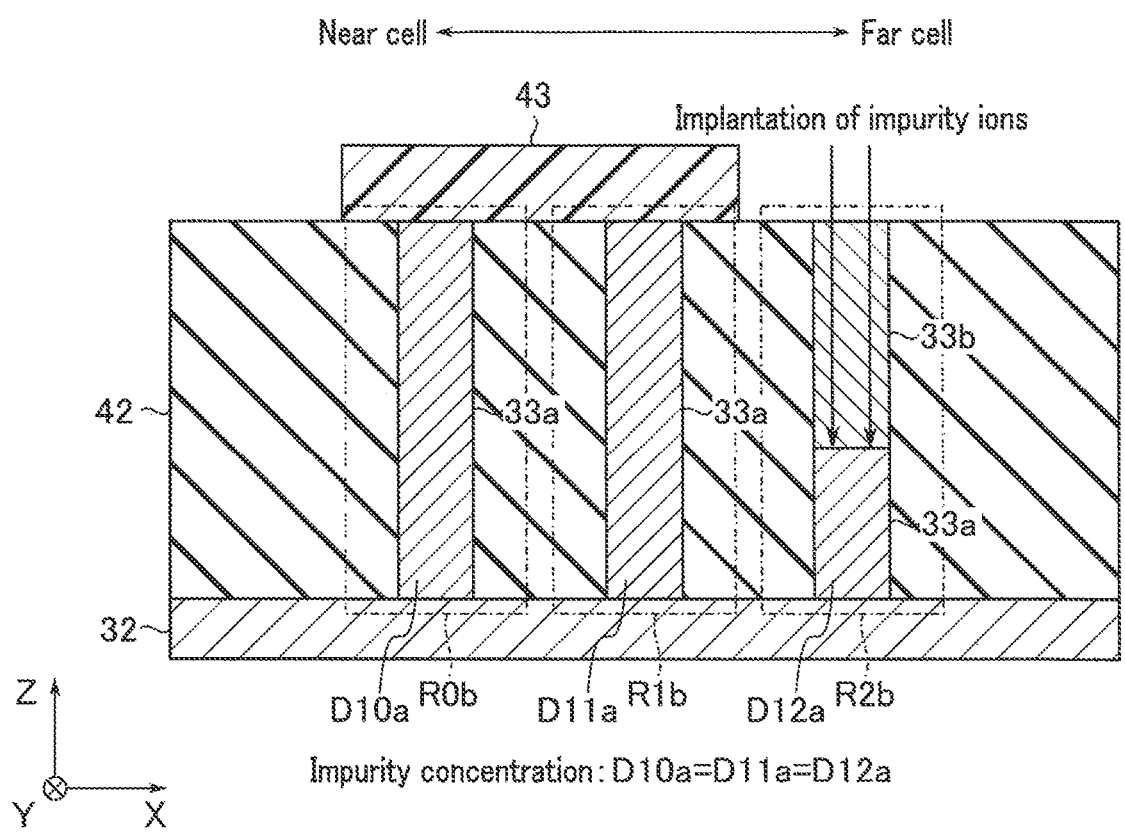
FIG. 17 is a cross-sectional view showing one example of a cross-sectional structure during a process of manufacturing the memory device according to the second modification of the first embodiment.
Figure 18:
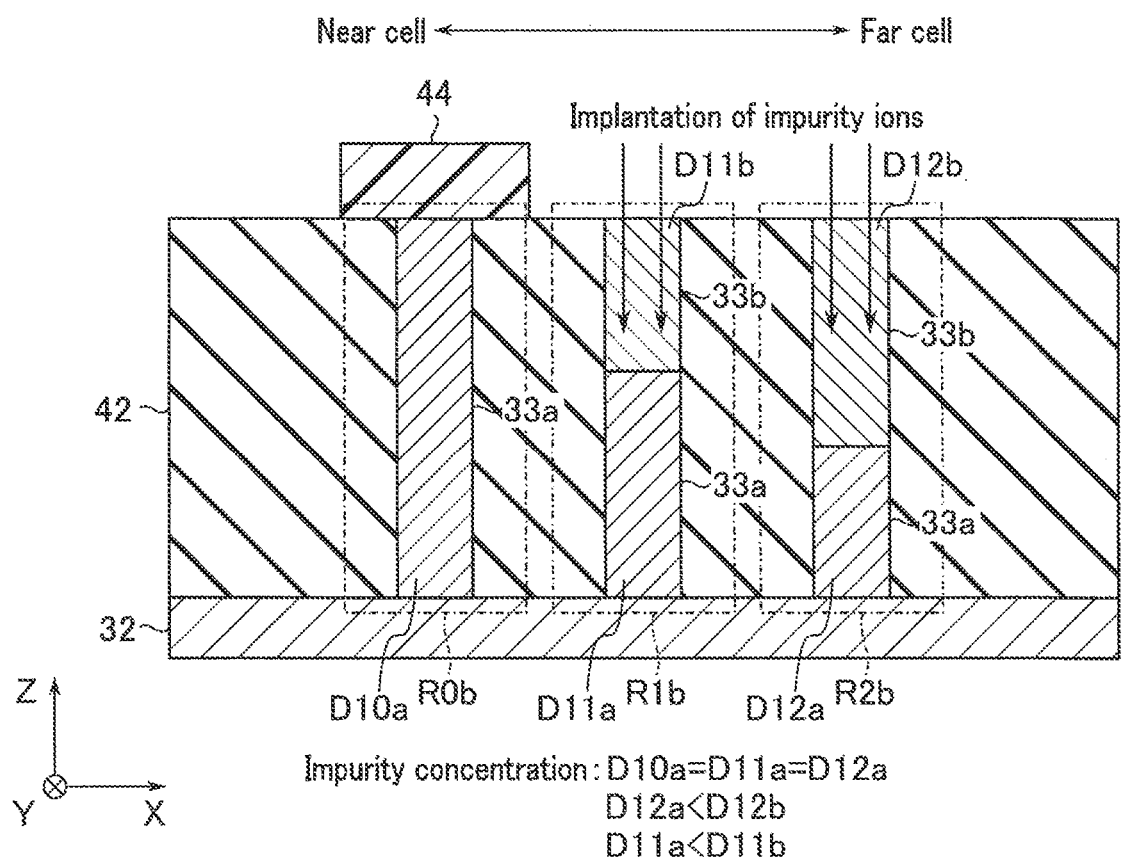
FIG. 18 is a cross-sectional view showing one example of a cross-sectional structure during a process of manufacturing the memory device according to the second modification of the first embodiment.

A method of manufacturing the memory device 1 according to the second modification of the first embodiment will be described with reference to FIG. 16 to FIG. 18. FIG. 16 is a flowchart showing one example of the method of manufacturing the contact plug CP1 in the memory device 1. FIG. 17 and FIG. 18 are each a cross-sectional view showing one example of a cross-sectional structure during a process of manufacturing the memory device 1. In the method of manufacturing the contact plugs CP1 in the memory device 1 according to the second modification of the first embodiment, S102 and S104 in FIG. 8 according to the first embodiment are replaced with S106 and S107. Furthermore, S105 in FIG. 8 according to the first embodiment is eliminated. S100, S101, and S103 are similar to those of the first embodiment. Hereinafter, the description will in principle concentrate on S106 and S107.

An exemplary process of manufacturing the contact plugs CP1 will be described below by suitably referring to FIG. 16.

The conductor 33a relatively low in impurity concentration is formed in S100, and the resist mask 43 is formed in S101. Thereafter, as shown in FIG. 17, implantation of impurity ions is performed into the conductor 33a in the region R2b (S106). In this manner, the conductor 33b higher in impurity concentration than the conductor 33a is formed on the upper portion of the conductor 33a in the region R2b. When the conductors 33a in the regions R0b to R2b respectively have impurity concentrations D10a to D12a, the concentrations D10a to D12a are the same. After ion implantation, the resist mask 43 is peeled.

The resist mask 44 is formed in S103. Thereafter, implantation of impurity ions is performed into each of the conductor 33a in the region R2b and the conductor 33a in the region R1b as shown in FIG. 18 (S107). The acceleration voltage used in ion implantation at this time is set to be lower than the acceleration voltage used in ion implantation performed in S106. In this manner, the depth of ion implantation into the conductor 33a in the region R1b is less than the depth of ion implantation into the conductor 33a in the region R2b performed in S106. As a result, the conductor 33b higher in impurity concentration than the conductor 33a is formed on the upper portion of each of the conductor 33a in the region R2b and the conductor 33a in the region R1b. When the impurity concentration of the conductor 33b in the region R2b is set to D12b, the concentration D12b is higher than the concentration D12a. When the impurity concentration of the conductor 33b in the region R1b is set to D11b, the concentration D11b is higher than the concentration D11a. The concentration D12b may be the same as or different from the concentration D11b. After ion implantation, the resist mask 44 is peeled.

Through S106 and S107, as a region provided with the contact plug CP1 is nearer to the row selection circuit 14, the ratio of the conductor 33b included in a contact plug CP1 in the region can be made lower. Through these steps, as a region provided with the contact plug CP1 is nearer to the row selection circuit 14, the height of the conductor 33b included in a contact plug CP1 in the region can be made lower.

1.5.3 Advantageous Effect of Present Modification

The present modification produces the advantageous effects similar to those of the first embodiment. As a matter of course, the first modification of the first embodiment is applicable to the contact plugs CP1 included in the memory device 1 according to the present modification.

1.6 Third Modification

A memory device according to a third modification of the first embodiment will be described. The memory device 1 according to the third modification of the first embodiment differs from that of the second modification of the first embodiment in terms of the configuration of the contact plugs CP1. In the following description, the description of similar configurations to those of the second modification of the first embodiment will be omitted, and the configurations different from those of the second modification of the first embodiment will be mainly described.

1.6.1 Structure of Memory Cell Array

The planer structure of the memory cell array 10 is similar to that of the second modification of the first embodiment.

Figure 19:
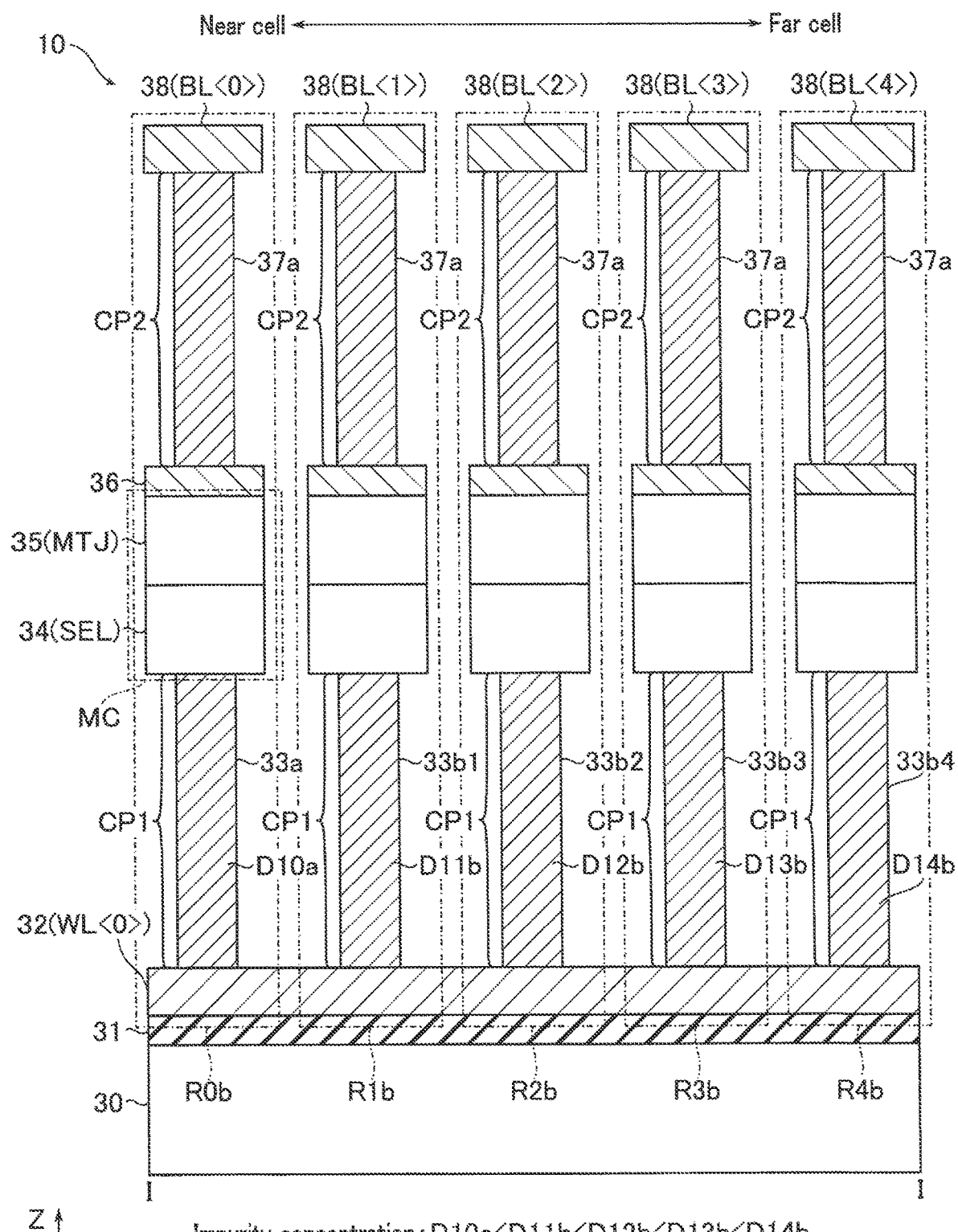
FIG. 19 is a cross-sectional view showing one example of a cross-sectional structure of a memory cell array included in a memory device according to a third modification of the first embodiment.

A cross-sectional structure of the memory cell array 10 will be described with reference to FIG. 19. FIG. 19 is a cross-sectional view taken along line I-I of FIG. 3. The example shown in FIG. 19 omits the insulating layer.

As shown in FIG. 19, the contact plug CP1 in the region R0b includes the conductor 33a. The contact plug CP1 in the region R1b includes a conductor 33b1. The contact plug CP1 in the region R2b includes a conductor 33b2. The contact plug CP1 in the region R3b includes a conductor 33b3. The contact plug CP1 in the region R4b includes a conductor 33b4. Each of the conductors 33a and 33b1 to 33b4 is formed of a similar material to that of the second modification of the first embodiment. The conductors 33a and 33b1 to 33b4 are, for example, an n-type semiconductor or a p-type semiconductor. The conductors 33a and 33b1 to 33b4 include at least one of silicon and germanium, for example. The conductors 33a and 33b1 to 33b4 include an impurity (dopant). Impurity is formed of a similar material to that of the second modification of the first embodiment.

The contact plugs CP1 in the regions R0b to R4b are substantially equal in diameter. The cross-sectional shape of each contact plug CP1 is not limited to a circular shape. Regardless of what cross-sectional shape the contact plugs CP1 take, the contact plugs CP1 in the regions R0b to R4b are substantially equal in terms of area in which the contact plug CP1 is in contact with the word line WL.

When the contact plugs CP1 (conductors 33a and 33b1 to 33b4) in the regions R0b to R4b respectively have impurity concentrations D10a and D11b to D14b, the concentration D10a is lower than the concentration D11b. The concentration D11b is lower than the concentration D12b. The concentration D12b is lower than the concentration D13b. The concentration D13b is lower than the concentration D14b. As described above, with respect to the contact plugs CP1 in the regions R0b to R4b, as a region provided with a contact plug CP1 is nearer to the row selection circuit 14, the impurity concentration of the contact plug CP1 in the region becomes lower. For example, the contact plugs CP1 (conductors 33b1 to 33b4) in the regions R1b to R4b can be configured in such a manner that the acceleration voltage used in ion implantation is set to the same voltage, and the ion implantation amount is less in a region provided with the contact plug CP1 nearer to the row selection circuit 14. Therefore, as a region provided with a contact plug CP1 is nearer to the row selection circuit 14, the resistance value of the contact plugs CP1 in the region becomes higher.

The remainder of the cross-sectional structure of the memory cell array 10 is similar to that of the second modification of the first embodiment.

In the case of k bit lines BL (where k is an integer greater than or equal to 1), the ion implantation for varying the impurity concentration is repeated (k−1) times.

1.6.2 Advantageous Effect of Present Modification

The present modification produces the advantageous effects similar to those of the first embodiment.

1.7 Fourth Modification

A memory device according to a fourth modification of the first embodiment will be described. The memory device 1 according to the fourth modification of the first embodiment differs from that of the third modification of the first embodiment in terms of how the impurity concentration of the contact plug CP1 is assigned. In the following description, description of configurations similar to those of the third modification of the first embodiment will be omitted, and configurations different from those of the third modification of the first embodiment will be mainly described.

1.7.1 Structure of Memory Cell Array

The planer structure of the memory cell array 10 is similar to that of the third modification of the first embodiment.

A cross-sectional structure of the memory cell array 10 will be described with reference to FIG. 20. FIG. 20 is a cross-sectional view taken along line I-I of FIG. 3. The example shown in FIG. 20 omits the insulating layer.

As shown in FIG. 20, the contact plugs CP1 in the regions R0*b* to R4*b* are substantially equal in diameter. The cross-sectional shape of each contact plug CP1 is not limited to a circular shape. Regardless of what cross-sectional shape the contact plugs CP1 take, the contact plugs CP1 in the regions R0*b* to R4*b* are substantially equal in terms of area in which the contact plug CP1 is in contact with the word line WL.

The regions R1*b* to R4*b* are divided into a group G0 including the two regions R1*b* and R2*b* adjacent to each other, and a group G1 including the two regions R3*b* and R4*b* adjacent to each other. The impurity concentrations D11*b* and D12*b* of the contact plugs CP1 (conductors 33*b*1 and 33*b*2) in the regions R1*b* and R2*b* are the same. The impurity concentrations D13*b* and D14*b* of the contact plugs CP1 (conductors 33*b*3 and 33*b*4) in the regions R3*b* and R4*b* are the same. The concentration D10*a* is lower than the concentrations D11*b* and D12*b*. The concentrations D11*b* and D12*b* are lower than the concentrations D13*b* and D14*b*. As described above, with respect to the contact plugs CP1 in the groups G0 and G1, as a group provided with the contact plug CP1 is nearer to the row selection circuit 14, the impurity concentration of the contact plug CP1 in the group becomes lower. Thus, as a group provided with the contact plug CP1 is nearer to the row selection circuit 14, the resistance value of the contact plug CP1 in the group becomes higher. The above description with reference to FIG. 20 refers to the case in which each group includes two regions adjacent to each other; however, this is not a limitation. For example, each group may include three or more regions adjacent to each other. Furthermore, the number of regions included in each group may differ between groups.

The remainder of the cross-sectional structure of the memory cell array 10 is similar to that of the third modification of the first embodiment.

1.7.2 Advantageous Effect of Present Modification

The present modification produces the advantageous effects similar to those of the first embodiment.

According to the present modification, the impurity concentration of the contact plug CP1 differs between the groups. This eliminates the need to vary the impurity concentration of the contact plug CP1 between the regions R1*b* to R4*b*. This reduces the variety of contact plugs CP1 of differing impurity concentrations as compared to the case in which the impurity concentrations of the contact plugs CP1 are varied individually. This can decrease the number of times the ion implantation for varying the impurity concentration is repeated. Thus, a process cost can be reduced.

2. Second Embodiment

A memory device according to a second embodiment will be described. The memory device 1 according to the second embodiment differs from that of the first embodiment in terms of the structure of the contact plugs CP1. In the following description, the description of similar configurations to those of the first embodiment will be omitted, and the configurations different from those of the first embodiment will be mainly described.

2.1 Structure of Memory Cell Array

The planer structure of the memory cell array 10 is similar to that of the first embodiment.

Figure 21:
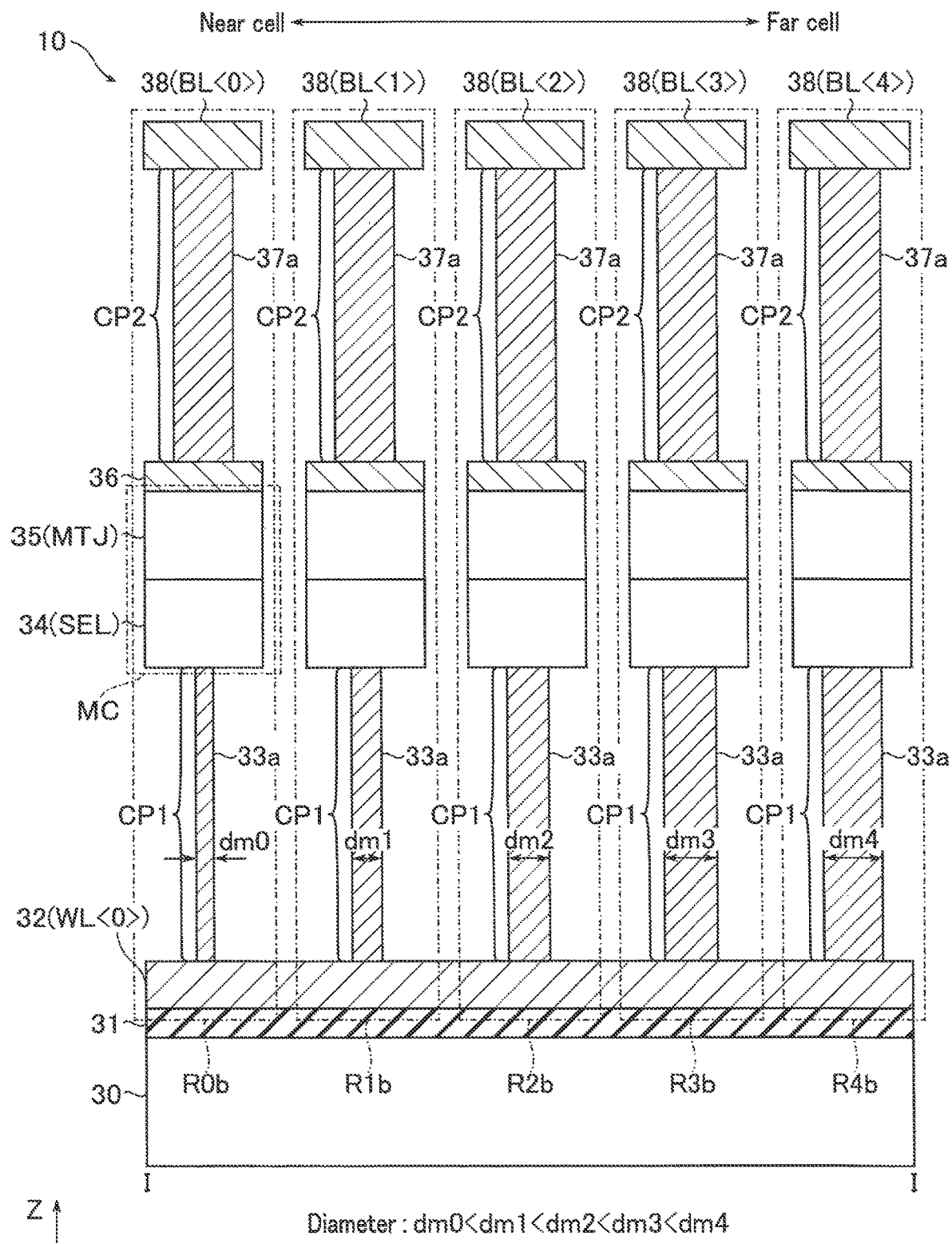
FIG. 21 is a cross-sectional view showing one example of a cross-sectional structure of a memory cell array included in a memory device according to a second embodiment.

A cross-sectional structure of the memory cell array 10 will be described with reference to FIG. 21. FIG. 21 is a cross-sectional view taken along line I-I of FIG. 3. The example shown in FIG. 21 omits the insulating layer.

As shown in FIG. 21, each of the contact plugs CP1 in the regions R0*b* to R4*b* includes the conductor 33*a*. The conductor 33*a* is formed of a similar material to that of the first embodiment.

When the contact plugs CP3 in the regions R0*b* to R4*b* have diameters dm0 to dm4, the diameter dm0 is smaller than the diameter dm1. The diameter dm1 is smaller than the diameter dm2. The diameter dm2 is smaller than the diameter dm3. The diameter dm3 is smaller than the diameter dm4. The cross-sectional shape (shape of the XY cross section) of each contact plug CP1 is not limited to a circular shape. For example, the cross-sectional shape of each contact plug CP1 may be ellipsoidal or rectangular. With respect to the contact plugs CP1 in the regions R0*b* to R4*b*, as a region provided with the contact plug CP1 is nearer to the row selection circuit 14, the area in which the contact plug CP1 is in contact with the word line WL becomes smaller, regardless of what cross-sectional shape the contact plug CP1 takes. Therefore, as a region provided with the contact plug CP1 is nearer to the row selection circuit 14, the resistance value of the contact plug CP1 in the region becomes higher.

The length of the word line WL from the row selection circuit 14 to the contact plug CP1 provided in the region R0*b* is smaller than the length of the word line WL from the row selection circuit 14 to the contact plug CP1 provided in the region R1*b*. The length of the word line WL from the row selection circuit 14 to the contact plug CP1 provided in the region R1*b* is smaller than the length of the word line WL from the row selection circuit 14 to the contact plug CP1 provided in the region R2*b*. The same applies to the subsequent regions.

The remainder of the cross-sectional structure of the memory cell array 10 is similar to that of the first embodiment.

2.2 Advantageous Effect of Present Embodiment

The second embodiment produces the advantageous effects similar to those of the first embodiment.

2.3 Modification

A memory device according to a modification of the second embodiment will be described. The memory device 1 according to a modification of the second embodiment differs from that of the second embodiment in terms of how to the diameter of the contact plug CP1 is assigned. In the following description, the description of similar configurations to those of the second embodiment will be omitted, and the configurations different from those of the second embodiment will be mainly described.

2.3.1 Structure of Memory Cell Array

The planer structure of the memory cell array 10 is similar to that of the second embodiment.

Figure 22:
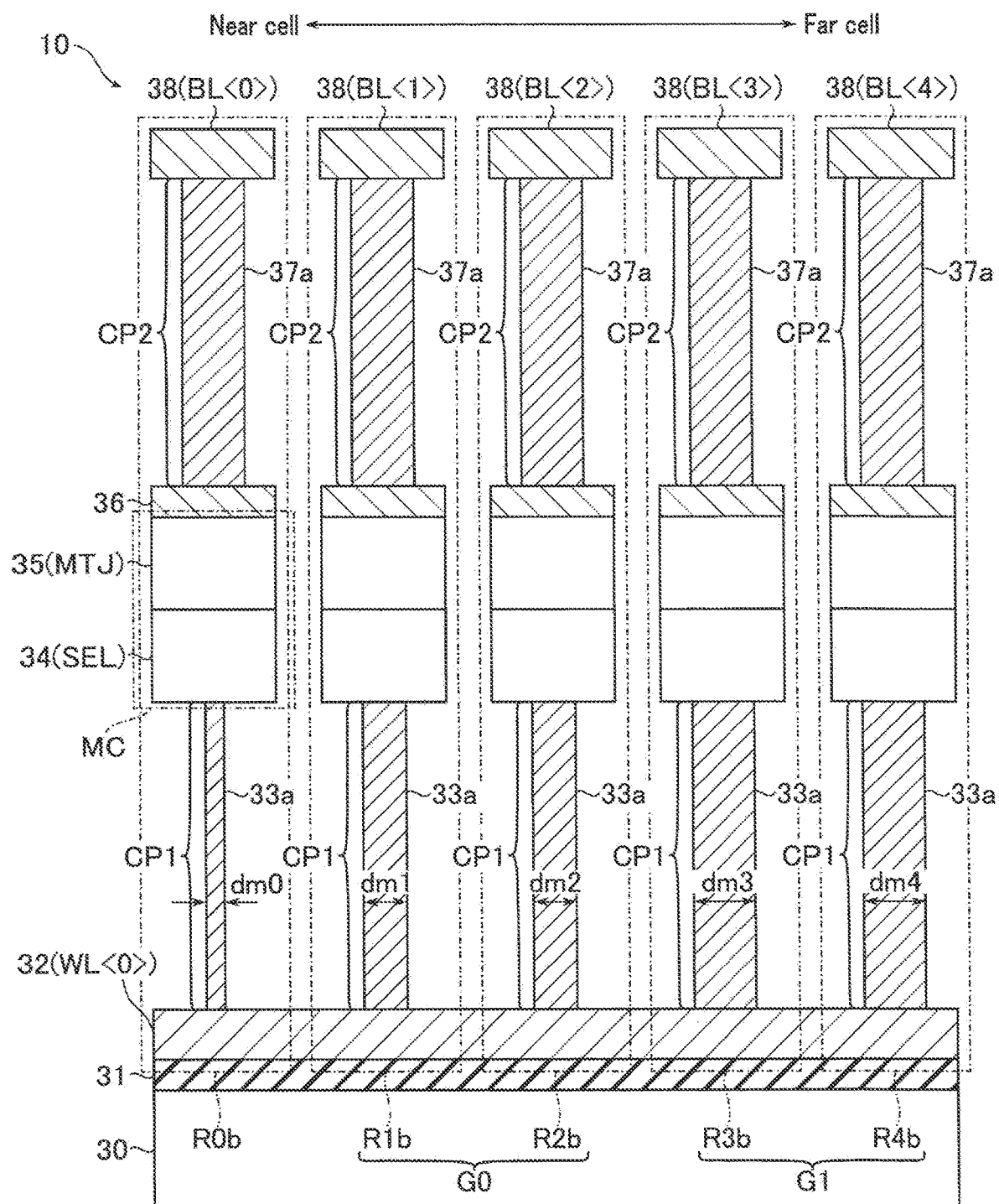
FIG. 22 is a cross-sectional view showing one example of a cross-sectional structure of a memory cell array included in a memory device according to a modification of the second embodiment.

A cross-sectional structure of the memory cell array 10 will be described with reference to FIG. 22. FIG. 22 is a cross-sectional view taken along line I-I of FIG. 3. The example shown in FIG. 22 omits the insulating layer.

As shown in FIG. 22, the regions R1*b* to R4*b* are divided into a group G0 including the two regions R1*b* and R2*b* adjacent to each other, and a group G1 including the two regions R3*b* and R4*b* adjacent to each other. The diameters dm1 and dm2 of the contact plugs CP1 in the regions R1*b* and R2*b* are the same. The diameters dm3 and dm4 of the contact plugs CP1 in the regions R3*b* and R4*b* are the same. The diameter dm0 is smaller than the diameters dm1 and dm2. The diameters dm1 and dm2 are smaller than the diameters dm3 and dm4. With respect to the contact plugs CP1 in the groups G0 and G1, as a group provided with the contact plug CP1 is nearer to the row selection circuit 14, the diameter of the contact plug CP1 in the group becomes smaller. The cross-sectional shape of each contact plug CP1 is not limited to a circular shape. With respect to the contact plugs CP1 in the groups G0 and G1, as a group provided with the contact plug CP1 is nearer to the row selection circuit 14, the area in which the contact plug CP1 is in contact with the word line WL becomes smaller, regardless of what cross-sectional shape the contact plug CP1 takes. Thus, as a group provided with the contact plug CP1 is nearer to the row selection circuit 14, the resistance value of the contact plug CP1 in the group becomes higher. The above description with reference to FIG. 22 refers to the case in which each group includes two regions adjacent to each other; however, this is not a limitation. For example, each group may include three or more regions adjacent to each other. Furthermore, the number of regions included in each group may be different between groups.

The remainder of the cross-sectional structure of the memory cell array 10 is similar to that of the second embodiment.

2.3.2 Advantageous Effect of Present Modification

The present modification produces the advantageous effects similar to those of the first embodiment.

According to the present modification, the diameter of the contact plug CP1 differs between the groups. The present modification therefore obviates the need for more complex manufacturing processes which would presumably be involved if all of the contact plugs CP1 had different diameters.

3. Third Modification

A memory device according to a third embodiment will be described. The memory device 1 according to the third embodiment differs from that of the first embodiment in terms of arrangement of the word line WL, the contact plugs CP1 and CP2, and the bit line BL. In the following description, the description of similar configurations to those of the first embodiment will be omitted, and the configurations different from those of the first embodiment will be mainly described.

3.1 Structure of Memory Cell Array

One example of the Structure of the memory cell array 10 will be described.

(Planar Structure)

Figure 23:
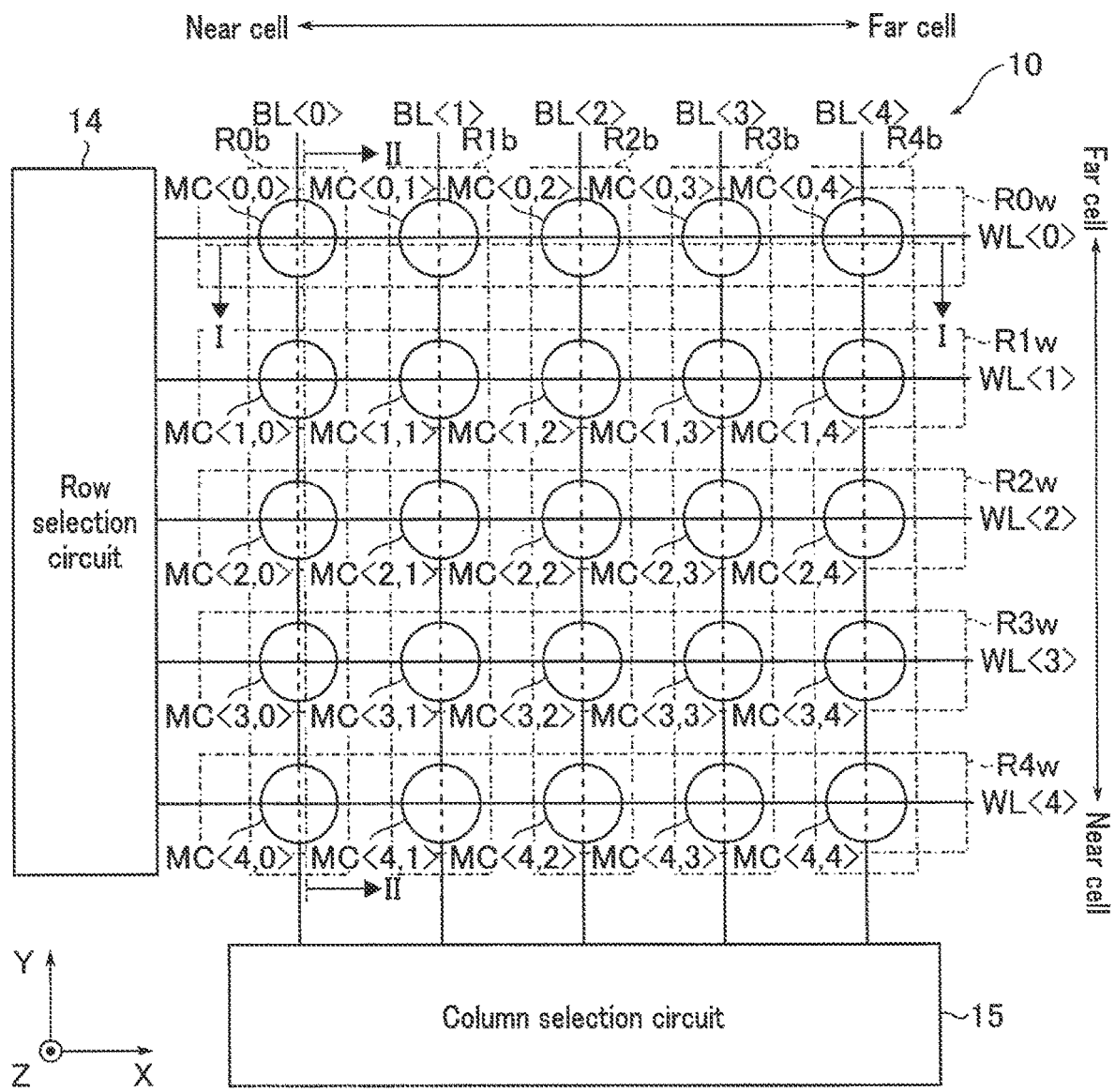
FIG. 23 is a plan view showing one example of a planar structure of a memory cell array included in a memory device according to a third embodiment.

A planar structure of the memory cell array 10 will be described with reference to FIG. 23. FIG. 23 is a plan view showing one example of a planar structure of the memory cell array 10. FIG. 23 shows the word lines WL between the memory cells MC and the row selection circuit 14, and the bit lines BL between the memory cells MC and the column selection circuit 15 in the memory cell array 10. FIG. 23 omits the word lines WL<5> to WL<M>, the bit lines BL<5> to BL<N>, and the plurality of memory cells MC corresponding to these word and bit lines.

As shown in FIG. 23, in the memory cell array 10, for example, the memory cells MC are arranged above the bit lines BL. The word lines WL are arranged above the memory cells MC.

(Cross-Sectional Structure)

Figure 24:
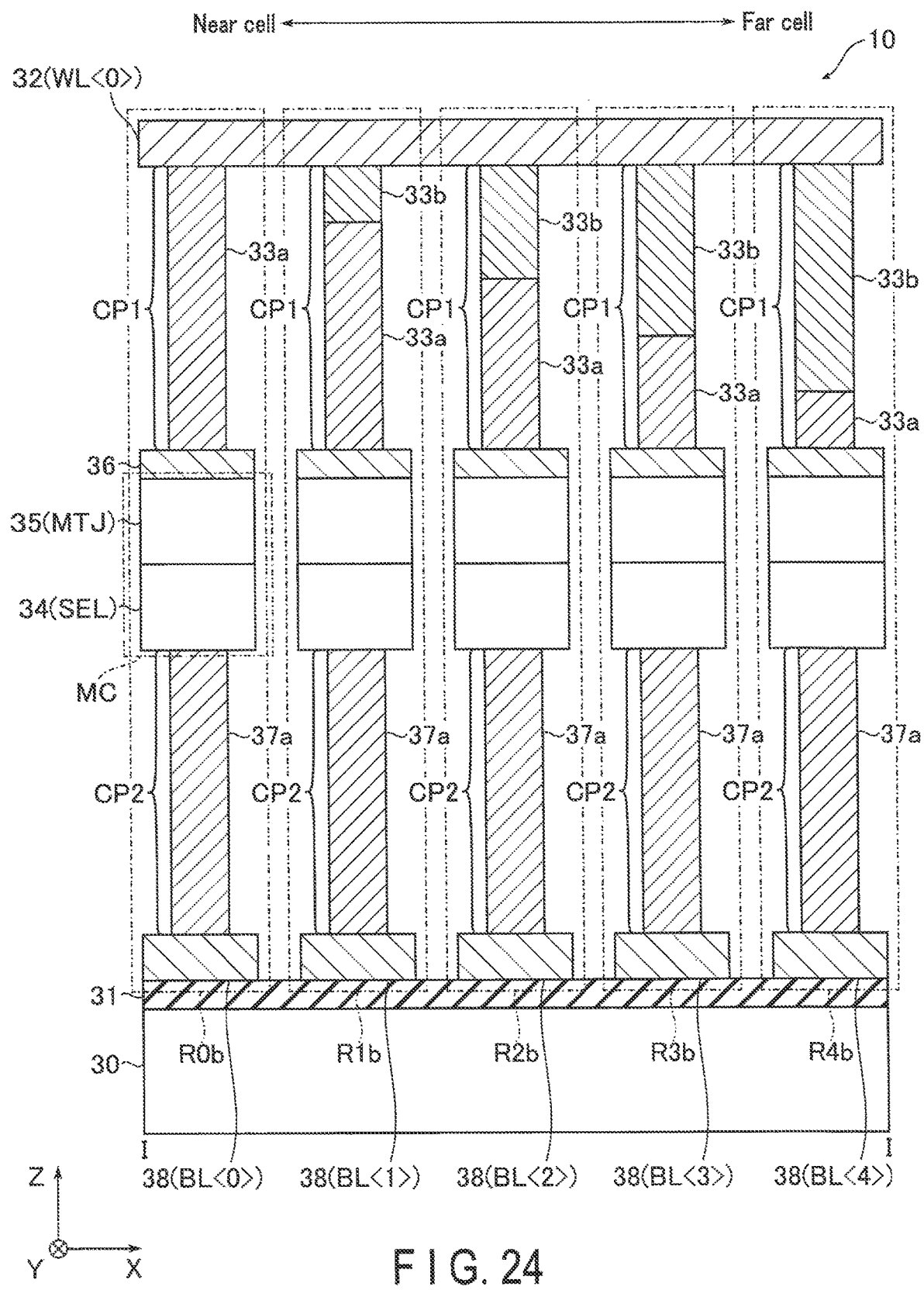
FIG. 24 is a cross-sectional view showing one example of a cross-sectional structure of the memory cell array included in the memory device according to the third embodiment.
Figure 25:
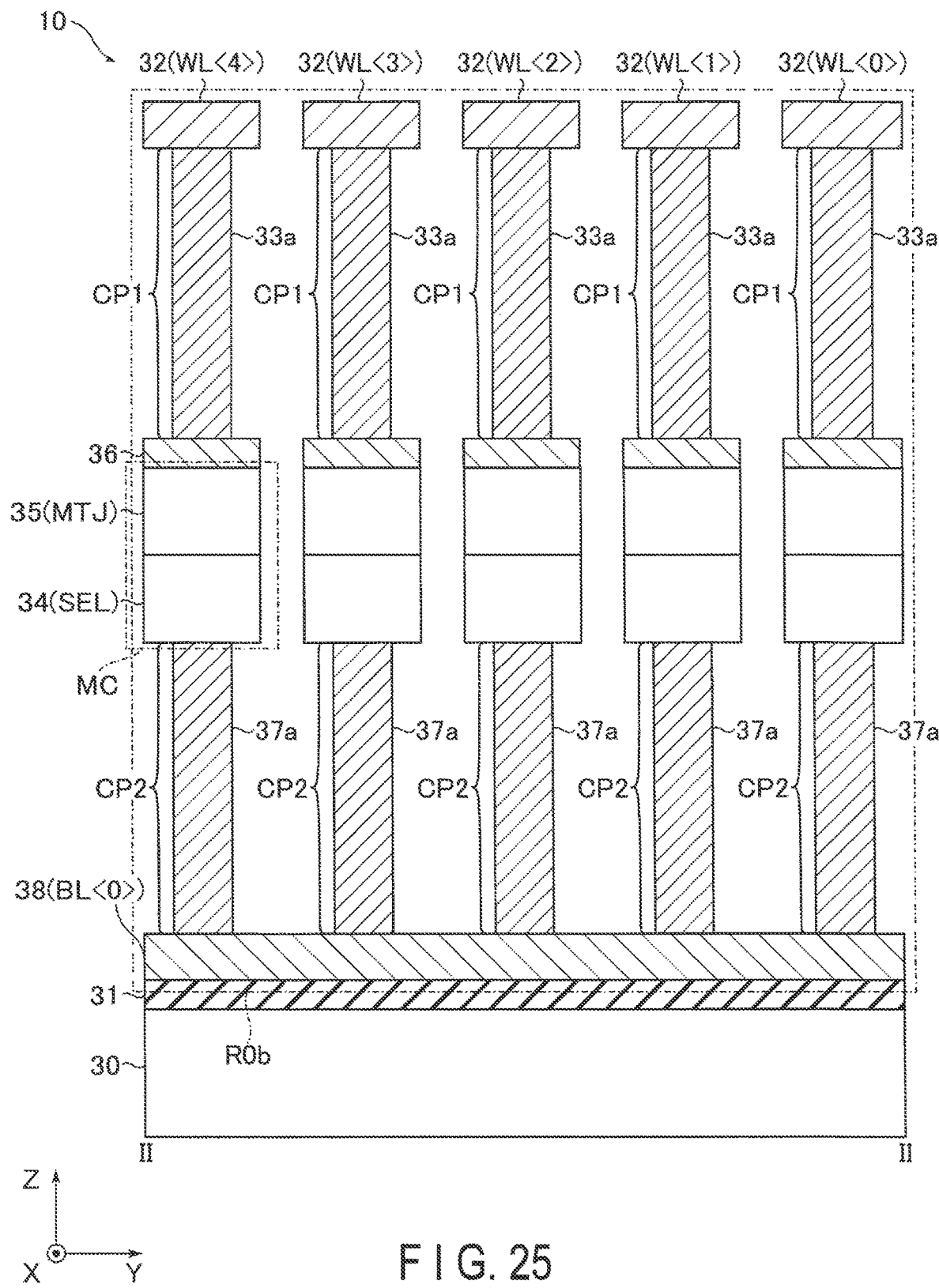
FIG. 25 is a cross-sectional view showing one example of a cross-sectional structure of the memory cell array included in the memory device according to the third embodiment.

A cross-sectional structure of the memory cell array 10 will be described with reference to in FIG. 24 to FIG. 26. FIG. 24 is a cross-sectional view taken along line I-I of FIG. 23. FIG. 25 is a cross-sectional view taken along line II-II of FIG. 23. FIG. 26 is a perspective view of a part of the memory cell array 10. The examples shown in FIG. 24 to FIG. 26 omit the insulating layer.

As shown in FIG. 24 to FIG. 26, a plurality of conductors 38 are provided above the semiconductor substrate 30, for example, with the insulating layer 31 intervening therebetween. The plurality of conductors 38 are provided side by side in the X direction, for example, and each extend in the Y direction. FIG. 26 omits the semiconductor substrate 30 and the insulating layer 31.

A plurality of contact plugs CP2 are provided on the upper surface of the single conductor 38. The plurality of contact plugs CP2 provided on the upper surface of the single conductor 38 are provided side by side in the Y direction, for example. The contact plug CP2 includes the conductor 37*a*.

The elements 34 is provided on the upper surface of the contact plug CP2.

The contact plug CP1 is provided on the upper surface of the conductor 36. The contact plug CP1 in the region R0*b* includes the conductor 33*a*. Each of the contact plugs CP1 in the regions R1*b* to R4*b* includes conductors 33*a* and 33*b*. The conductors 33*a* and 33*b* are formed of a similar material to that of the first embodiment.

The contact plugs CP1 in the regions R0*b* to R4*b* are substantially equal in diameter. The cross-sectional shape (shape of the XY cross section) of each contact plug CP1 is not limited to a circular shape. For example, the cross-sectional shape of each contact plug CP1 may be ellipsoidal or rectangular. Regardless of what cross-sectional shape the contact plugs CP1 take, the contact plugs CP1 in the regions R0*b* to R4*b* are substantially equal in terms of area in which the contact plug CP1 is in contact with the word line WL.

With respect to the contact plugs CP1 in the regions R1*b* to R4*b*, as a region provided with the contact plug CP1 is nearer to the row selection circuit 14, the ratio of the conductor 33*b* included in the contact plug CP1 in the region becomes lower. With respect to the contact plugs CP1 in the regions R1*b* to R4*b*, as a region provided with the contact plug CP1 is nearer to the row selection circuit 14, the height of the conductor 33*b* included in the contact plug CP1 in the region becomes lower. The conductor 33*b* is provided on the conductor 33*a*. The conductor 33*a* may be provided on the conductor 33*b*. Each of the contact plugs CP1 in the regions R1*b* to R4*b* may be formed of three or more conductors each having different resistivity. The conductors 33*a* and 33*b* may include two or more materials.

The conductor 32 is provided on the upper surface of the contact plug CP1. The plurality of conductors 32 are provided side by side in the Y direction, for example, and each extend in the X direction. The plurality of contact plugs CP1 provided side by side in the X direction are coupled to the single conductor 32.

As shown in FIG. 26, each intersection between the conductor 32 and the conductor 38 is provided with the single memory cell MC.

3.2 Advantageous Effect of Present Embodiment

The third embodiment produces the advantageous effects similar to those of the first embodiment. As a matter of course, the first to fourth modifications of the first embodiment are applicable to the contact plugs CP1 included in the memory device 1 according to the present embodiment.

4. Fourth Embodiment

A memory device according to a fourth embodiment will be described. The memory device 1 according to the fourth embodiment differs from that of the third embodiment in terms of the structure of the contact plugs CP1. In the following description, the description of similar configurations to those of the third embodiment will be omitted, and the configurations different from those of the third embodiment will be mainly described.

4.1 Structure of Memory Cell Array

The planer structure of the memory cell array 10 is similar to that of the third embodiment.

Figure 27:
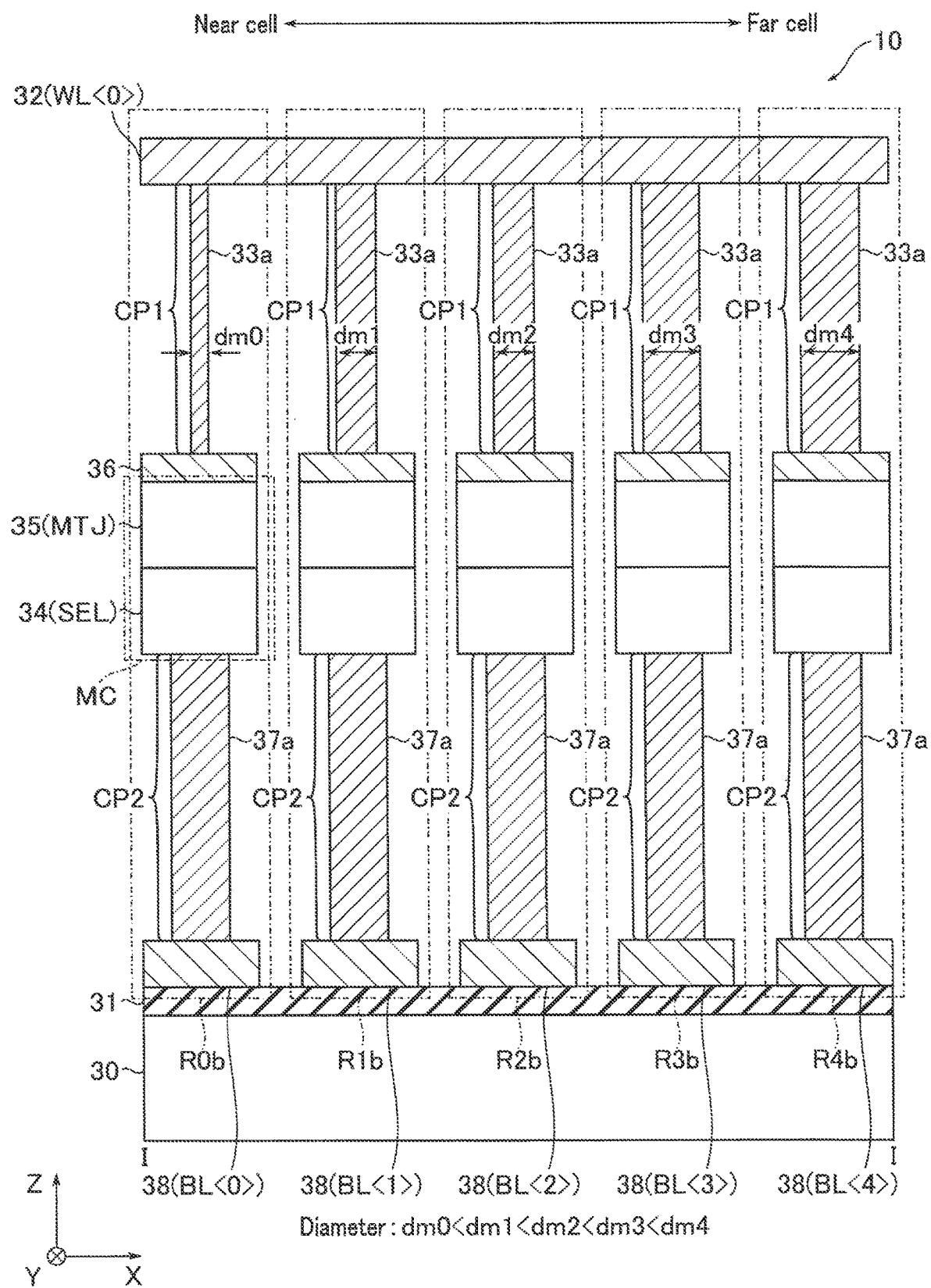
FIG. 27 is a cross-sectional view showing one example of a cross-sectional structure of a memory cell array included in a memory device according to a fourth embodiment.

A cross-sectional structure of the memory cell array 10 will be described with reference to FIG. 27. FIG. 27 is a cross-sectional view taken along line I-I of FIG. 23. The example shown in FIG. 27 omits the insulating layer.

As shown in FIG. 27, each of the contact plugs CP1 in the regions R0b to R4b includes the conductor 33a. The conductor 33a is formed of a similar material to that described in the second embodiment.

The diameter dm0 is smaller than the diameter dm1. The diameter dm1 is smaller than the diameter dm2. The diameter dm2 is smaller than the diameter dm3. The diameter dm3 is smaller than the diameter dm4. The cross-sectional shape (shape of the XY cross section) of each contact plug CP1 is not limited to a circular shape. For example, the cross-sectional shape of each contact plug CP1 may be ellipsoidal or rectangular. With respect to the contact plugs CP1 in the regions R0b to R4b, as a region provided with the contact plug CP1 is nearer to the row selection circuit 14, the area in which the contact plug CP1 is in contact with the word line WL becomes smaller, regardless of what cross-sectional shape the contact plug CP1 takes.

The remainder of the cross-sectional structure of the memory cell array 10 is similar to that of the third embodiment.

4.2 Advantageous Effect of Present Embodiment

The fourth embodiment produces the advantageous effects similar to those of the first embodiment. As a matter of course, the modification of the second embodiment is applicable to the contact plugs CP1 included in the memory device 1 according to the present embodiment.

5. Fifth Embodiment

A memory device according to a fifth embodiment will be described. The memory device 1 according to the fifth embodiment differs from that of the first embodiment in terms of the structure of the contact plugs CP2. In the following description, the description of similar configurations to those of the first embodiment will be omitted, and the configurations different from those of the first embodiment will be mainly described.

5.1 Structure of Memory Cell Array

The planer structure of the memory cell array 10 is similar to that of the first embodiment.

Figure 28:
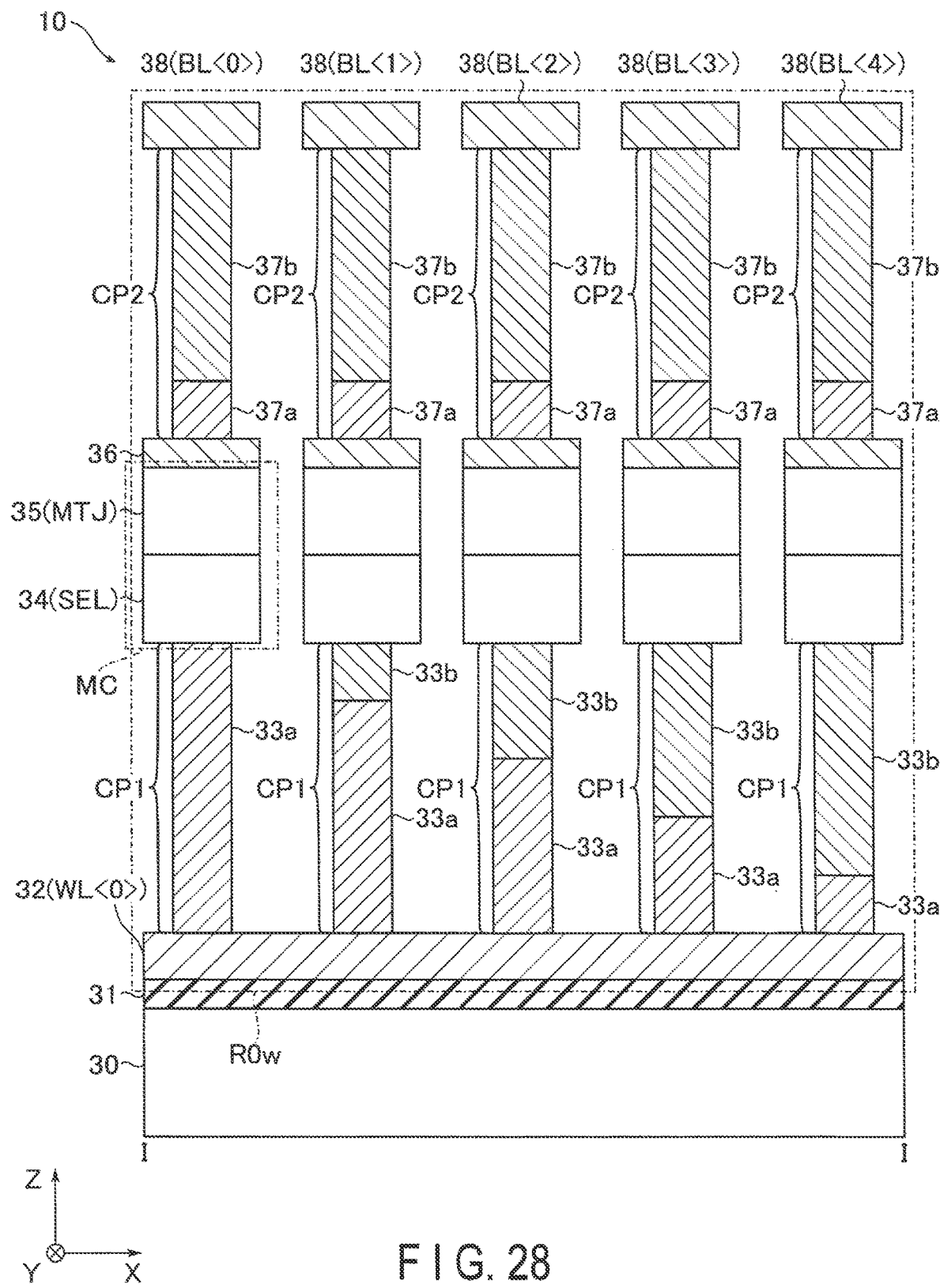
FIG. 28 is a cross-sectional view showing one example of a cross-sectional structure of a memory cell array included in a memory device according to a fifth embodiment.
Figure 29:
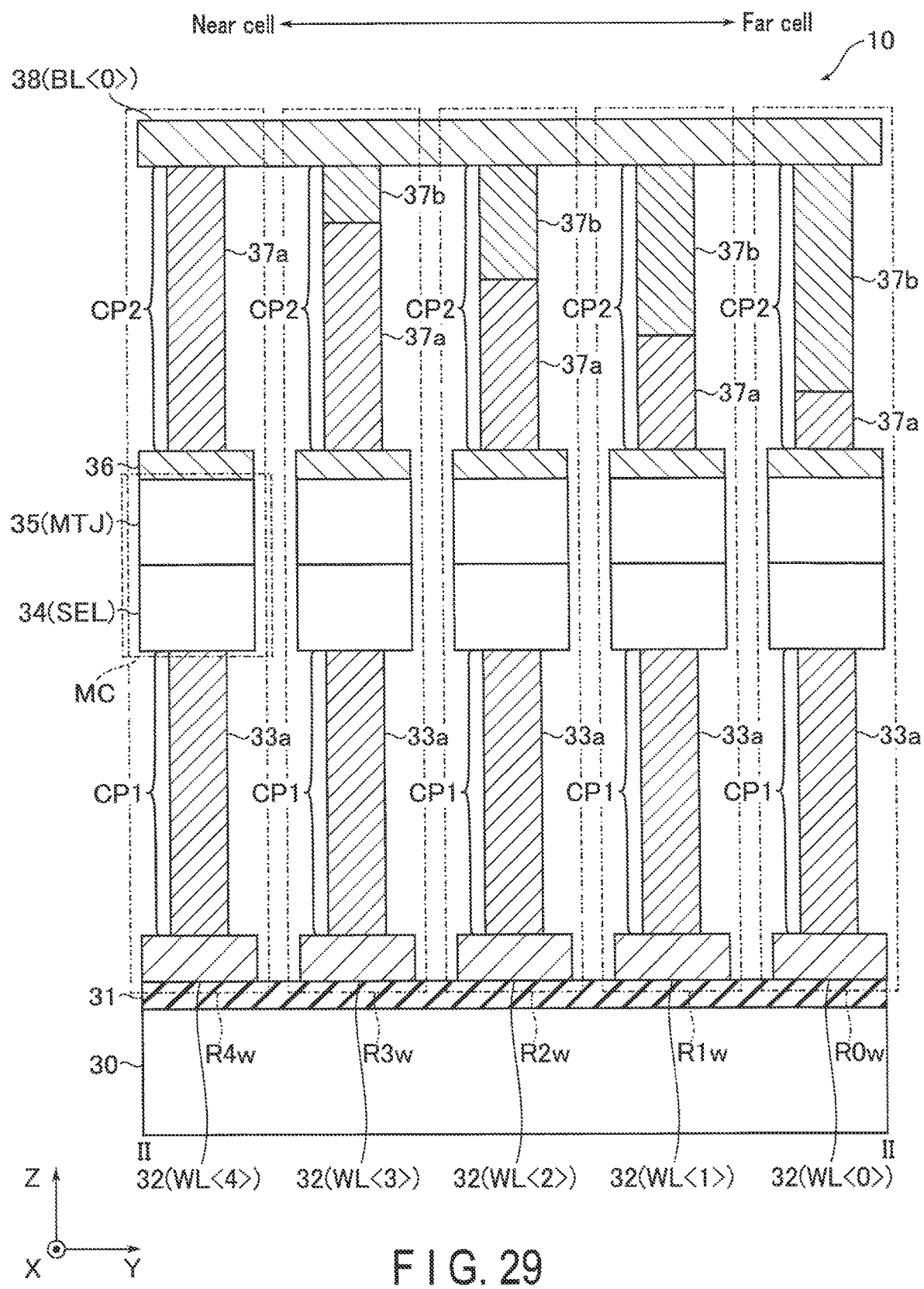
FIG. 29 is a cross-sectional view showing one example of a cross-sectional structure of the memory cell array included in the memory device according to the fifth embodiment.

A cross-sectional structure of the memory cell array 10 will be described with reference to in FIG. 28 and FIG. 29. FIG. 28 is a cross-sectional view taken along line I-I of FIG. 3. FIG. 29 is a cross-sectional view taken along line II-II of FIG. 3. The examples shown in FIG. 28 and FIG. 29 omit the insulating layer.

As shown in FIG. 28 and FIG. 29, the contact plug CP2 in the region R4w includes the conductor 37a. Each of the contact plugs CP2 in the regions R0w to R3w includes the conductors 37a and 37b. The conductor 37a is formed of a similar material to that of the conductor 33a. The conductor 37b is formed of a similar material to that of the conductor 33b.

The contact plugs CP2 in the regions R0w to R4w are substantially equal in diameter. The cross-sectional shape (shape of the XY cross section) of each contact plug CP2 is not limited to a circular shape. For example, the cross-sectional shape of each contact plug CP2 may be ellipsoidal or rectangular. Regardless of what cross-section shape the contact plugs CP2 take, the contact plugs CP2 in the regions R0w to R4w are substantially equal in terms of area in which the contact plug CP2 is in contact with the bit line BL.

With respect to the contact plugs CP2 in the regions R0w to R3w, as a region provided with the contact plug CP2 is nearer to the column selection circuit 15, the ratio of the conductor 37b included in the contact plug CP2 in the region becomes lower. With respect to the contact plugs CP2 in the regions R0w to R3w, as a region provided with the contact plug CP2 is nearer to the column selection circuit 15, the height of the conductor 37b included in the contact plug CP2 in the region becomes lower. Therefore, as a region provided with the contact plug CP2 is nearer to the column selection circuit 15, the resistance value of the contact plug CP2 in the region becomes higher. The conductor 37b is provided on the conductor 37a. The conductor 37a may be provided on the conductor 37b. Each of the contact plugs CP2 in the regions R0w to R3w may be formed of three or more conductors each having different resistivity. The conductors 37a and 37b may include two or more materials.

The length of the bit line BL from the column selection circuit 15 to the contact plug CP2 provided in the region R4w is smaller than the length of the bit line BL from the column selection circuit 15 to the contact plug CP2 provided in the region R3w. The length of the bit line BL from the column selection circuit 15 to the contact plug CP2 provided in the region R3w is smaller than the length of the bit line BL from the column selection circuit 15 to the contact plug CP2 provided in the region R2w. The same applies to the subsequent regions.

The remainder of the cross-sectional structure of the memory cell array 10 is similar to that of the first embodiment.

5.2 Advantageous Effect of Present Embodiment

The fifth embodiment produces the advantageous effects similar to those of the first embodiment.

Furthermore, as described in the first embodiment, as a memory cell MC is nearer to the column selection circuit 15, the resistance value of the bit line BL between the memory cell. MC and the column selection circuit 15 becomes lower. It is assumed that the plurality of contact plugs CP2 coupled to the bit line BL are equal in terms of resistance value. In this case, the resistance value of a wiring path including the bit line BL and the contact plug CP2 from the column selection circuit 15 to the memory cell MC (hereinafter, also referred to as a "column selection circuit-intercell wiring path") varies depending on the length of the bit line BL from the column selection circuit 15 to the contact plug CP2.

According to the present embodiment, the variation in resistance value of the column selection circuit-intercell wiring path due to the length of the bit line BL can be suppressed by combining the aforementioned resistance value of the bit line BL with the resistance value of the contact plug CP2.

As a matter of course, the first modification to the fourth modification of the first embodiment, the second embodiment, and the modification of the second embodiment are applicable to the contact plugs CP1 and CP2 included in the memory device 1 according to the present embodiment.

6. Sixth Embodiment

A memory device according to a sixth embodiment will be described. The memory device 1 according to the sixth embodiment differs from that of the third embodiment in terms of the structure of the contact plugs CP2. In the following description, the description of similar configurations to those of the third embodiment will be omitted, and the configurations different from those of the third embodiment will be mainly described.

6.1 Structure of Memory Cell Array

The planer structure of the memory cell array 10 is similar to that of the third embodiment.

Figure 30:
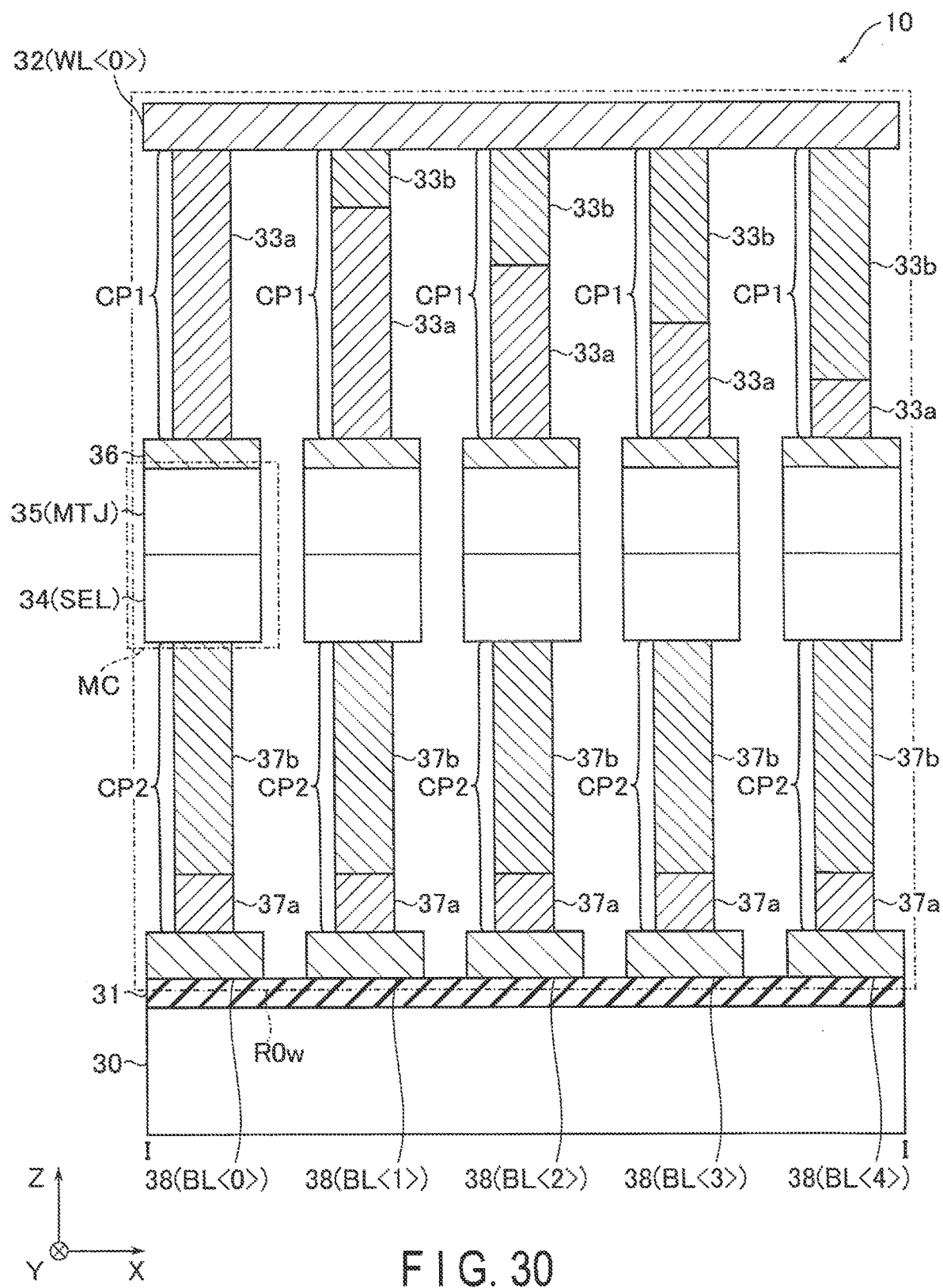
FIG. 30 is a cross-sectional view showing one example of a cross-sectional structure of a memory cell array included in a memory device according to a sixth embodiment.
Figure 31:
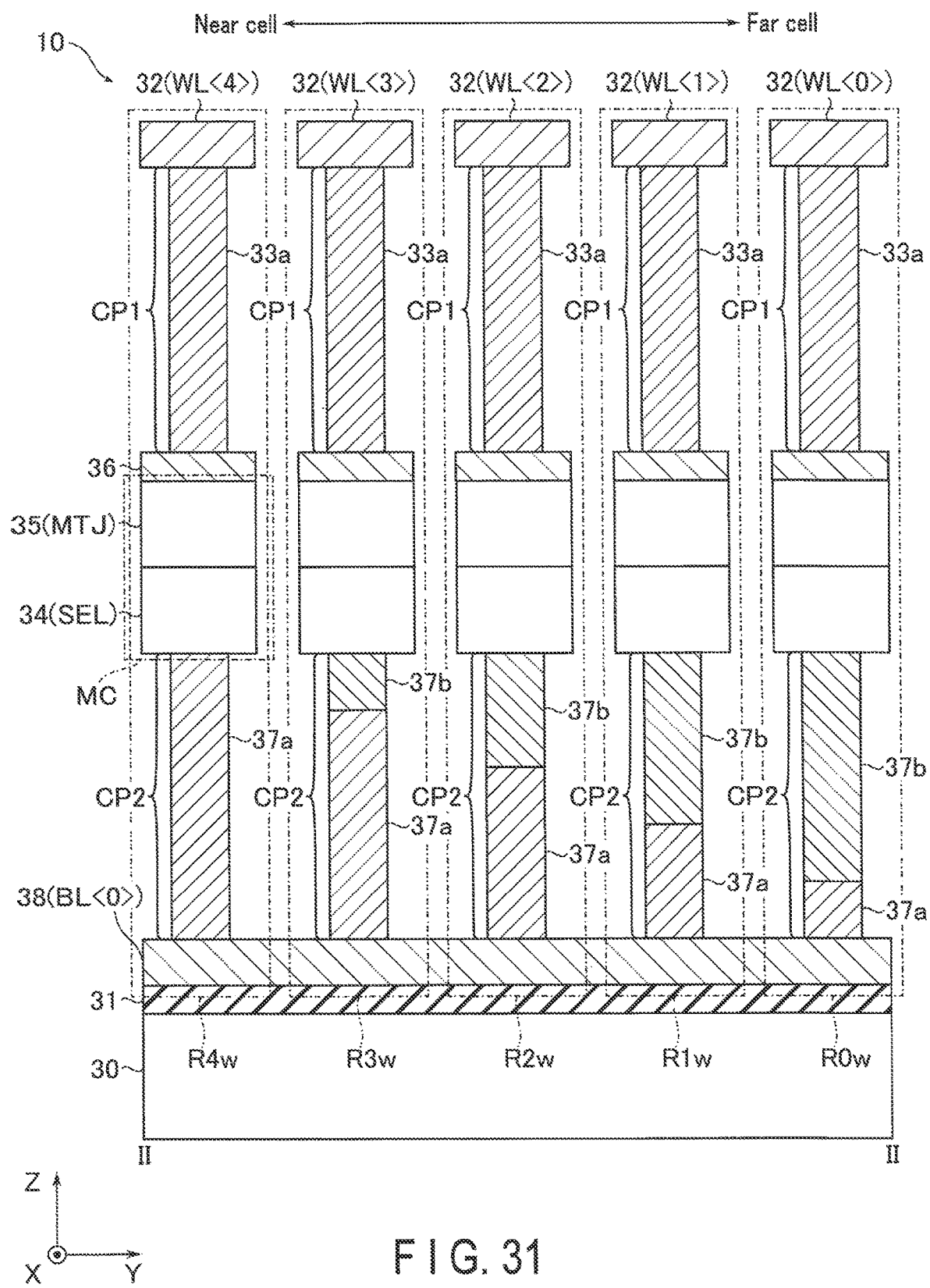
FIG. 31 is a cross-sectional view showing one example of a cross-sectional structure of the memory cell array included in the memory device according to the sixth embodiment.

A cross-sectional structure of the memory cell array 10 will be described with reference to in FIG. 30 and FIG. 31. FIG. 30 is a cross-sectional view taken along line I-I of FIG. 23. FIG. 31 is a cross-sectional view taken along line II-II of FIG. 23. The examples shown in FIG. 30 and FIG. 31 omit the insulating layer.

As shown in FIG. 30 and FIG. 31, the contact plug CP2 in the region R4w includes the conductor 37a. Each of the contact plugs CP2 in the regions R0w to R3w includes the conductors 37a and 37b. The conductor 37a is formed of a similar material to that of the conductor 33a. The conductor 37b is formed of a similar material to that of the conductor 33b.

The contact plugs CP2 in the regions R0w to R4w are substantially equal in diameter. The cross-sectional shape (shape of the XY cross section) of each contact plug CP2 is not limited to a circular shape. For example, each contact plug CP2 may be ellipsoidal or rectangular. Regardless of what cross-sectional shape the contact plugs CP2 take, the contact plugs CP2 in the regions R0w to R4w are substantially equal in terms of area in which the contact plug CP2 is in contact with the bit line BL.

With respect to the contact plugs CP2 in the regions R0w to R3w, as a region provided with the contact plug CP2 is nearer to the column selection circuit 15, the ratio of the conductor 37b included in the contact plug CP2 in the region becomes lower. With respect to the contact plugs CP2 in the regions R0w to R3w, as a region provided with the contact plug CP2 is nearer to the column selection circuit 15, the height of the conductor 37b included in the contact plug CP2 in the region becomes lower. The conductor 37b is provided on the conductor 37a. The conductor 37a may be provided on the conductor 37b. Each of the contact plugs CP2 in the regions R0w to R3w may be formed of three or more conductors each having different resistivity. The conductors 37a and 37b may include two or more materials.

The length of the bit line BL from the column selection circuit 15 to the contact plug CP2 provided in the region R4w is smaller than the length of the bit line BL from the column selection circuit 15 to the contact plug CP2 provided in the region R3w. The length of the bit line BL from the column selection circuit 15 to the contact plug CP2 provided in the region R3w is smaller than the length of the bit line BL from the column selection circuit 15 to the contact plug CP2 provided in the region R2w. The same applies to the subsequent regions.

The remainder of the cross-sectional structure of the memory cell array 10 is similar to that of the third embodiment.

6.2 Advantageous Effect of Present Embodiment

The sixth embodiment produces the advantageous effects similar to those of the first embodiment. The present embodiment produces the advantageous effects similar to those of the fifth embodiment. As a matter of course, the first modification to the fourth modification of the first embodiment, the second embodiment, and the modification of the second embodiment are applicable to the contact plugs CP1 and CP2 included in the memory device 1 according to the present modification.

7. Modification, Etc

As described above, the memory device according to an embodiment includes a first memory cell (MC); a second memory cell (MC); a first circuit (14) configured to supply a write current to the first memory cell and the second memory cell; a first wiring (WL) coupled to the first circuit; a first electrode (CP1) configured to electrically couple the first memory cell to the first wiring; and a second electrode (CP1) configured to electrically couple the second memory cell to the first wiring. A length of the first wiring (WL) from the first circuit to the first electrode is smaller than a length of the first wiring (WL) from the first circuit to the second electrode. A resistance value of the first electrode (CP1) is higher than a second resistance value of the second electrode (CP1).

The embodiments are not limited to those described in the above, and various modifications can be made.

Furthermore, the order of the steps in the flowchart described in the above embodiments may be altered as much as possible.

Each of the above embodiments mainly described a configuration (referred to as a "single-layered structure") in which one memory cell MC is selectable according to a pair of one word line WL and one bit line BL; however, this is not a limitation. For example, a discretionary array structure such as an array structure in which a plurality of structures described above are stacked in the Z direction is applicable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
   a first memory cell;
   a second memory cell;
   a first circuit configured to supply a write current to the first memory cell and the second memory cell;
   a first wiring coupled to the first circuit;
   a first electrode configured to electrically couple the first memory cell to the first wiring; and
   a second electrode configured to electrically couple the second memory cell to the first wiring,
   wherein:

a length of the first wiring from the first circuit to the first electrode is smaller than a length of the first wiring from the first circuit to the second electrode, and a resistance value of the first electrode is higher than a resistance value of the second electrode.

2. The device according to claim 1, wherein:

the first electrode includes a first conductor and a second conductor, the second electrode includes a third conductor and a fourth conductor, a resistivity of the second conductor is lower than a resistivity of the first conductor, a resistivity of the fourth conductor is lower than a resistivity of the third conductor, and a ratio of the second conductor included in the first electrode is lower than a ratio of the fourth conductor included in the second electrode.

3. The device according to claim 2, wherein:

the first conductor and the third conductor include at least one of tungsten, tungsten nitride, titanium, titanium nitride, carbon, or polycrystalline silicon, and the second conductor and the fourth conductor include at least one of copper or aluminum.

4. The device according to claim 2, wherein:

the first conductor and the third conductor include at least one of carbon or polycrystalline silicon, and the second conductor and the fourth conductor include at least one of tungsten, tungsten nitride, titanium, or titanium nitride.

5. The device according to claim 2, wherein:

the first conductor and the third conductor include a first semiconductor, the second conductor and the fourth conductor include a second semiconductor, and an impurity concentration of the first semiconductor is lower than an impurity concentration of the second semiconductor.

6. The device according to claim 2, wherein:

the second conductor is provided on the first conductor, and the fourth conductor is provided on the third conductor.

7. The device according to claim 1, wherein:

the first electrode includes a first semiconductor, the second electrode includes a second semiconductor, and an impurity concentration of the first semiconductor is lower than an impurity concentration of the second semiconductor.

8. The device according to claim 1, wherein an area in which the first electrode is in contact with the first wiring is smaller than an area in which the second electrode is in contact with the first wiring.

9. The device according to claim 8, wherein a cross-sectional shape of the first electrode and the second electrode is circular.

10. The device according to claim 9, wherein a diameter of the first electrode is smaller than a diameter of the second electrode.

11. The device according to claim 1, wherein the first memory cell and the second memory cell are arranged above the first wiring.

12. The device according to claim 1, wherein the first wiring is arranged above the first memory cell and the second memory cell.

13. The device according to claim 1, further comprising:

a third memory cell;

a fourth memory cell;

a third electrode configured to electrically couple the third memory cell to the first wiring; and a fourth electrode configured to electrically couple the fourth memory cell to the first wiring, wherein:

a length of the first wiring from the first circuit to the third electrode is greater than a length of the first wiring from the first circuit to the first electrode, and is smaller than a length of the first wiring from the first circuit to the second electrode, a length of the first wiring from the first circuit to the fourth electrode is greater than a length of the first wiring from the first circuit to the second electrode, a resistance value of the third electrode is equal to a resistance value of the first electrode, and a resistance value of the fourth electrode is equal to a resistance value of the second electrode.

14. The device according to claim 13, wherein;

the first electrode includes a first conductor and a second conductor, the second electrode includes a third conductor and a fourth conductor, the third electrode includes a fifth conductor and a sixth conductor, the fourth electrode includes a seventh conductor and an eighth conductor, a resistivity of the second conductor is lower than a resistivity of the first conductor, a resistivity of the fourth conductor is lower than a resistivity of the third conductor, a ratio of the second conductor included in the first electrode is lower than a ratio of the fourth conductor included in the second electrode, a resistivity of the fifth conductor is equal to a resistivity of the first conductor, a resistivity of the sixth conductor is equal to a resistivity of the second conductor, a resistivity of the seventh conductor is equal to a resistivity of the third conductor, a resistivity of the eighth conductor is equal to a resistivity of the fourth conductor, a ratio of the sixth conductor included in the third electrode is equal to a ratio of the second conductor included in the first electrode, and a ratio of the eighth conductor included in the fourth electrode is equal to a ratio of the fourth conductor included in the second electrode.

15. The device according to claim 13, wherein:

an area in which the first electrode is in contact with the first wiring is smaller than an area in which the second electrode is in contact with the first wiring, an area in which the third electrode is in contact with the first wiring is equal to an area in which the first electrode is in contact with the first wiring, and an area in which the fourth electrode is in contact with the first wiring is equal to an area in which the second electrode is in contact with the first wiring.

16. The device according to claim 1, further comprising:

a fifth memory cell;

a sixth memory cell;

a second circuit configured to supply a write current to the fifth memory cell and the sixth memory cell;

a second wiring coupled to the second circuit;

a fifth electrode electrically coupling the fifth memory cell to the second wiring; and a sixth electrode electrically coupling the sixth memory cell to the second wiring, wherein:
a length of the second wiring from the second circuit to the fifth electrode is smaller than a length of the second wiring from the second circuit to the sixth electrode, and
a resistance value of the fifth electrode is higher than a resistance value of the sixth electrode.

17. The device according to claim 16, wherein the second wiring is arranged above the fifth memory cell and the sixth memory cell.

18. The device according to claim 16, wherein the fifth memory cell and the sixth memory cell are arranged above the second wiring.

19. The device according to claim 1, wherein the first memory cell and the second memory cell include a variable resistance element.

20. The device according to claim 19, wherein the variable resistance element is a magnetoresistance effect element.

* * * * *